(12) United States Patent
Wolk et al.

(10) Patent No.: US 6,291,116 B1
(45) Date of Patent: Sep. 18, 2001

(54) THERMAL TRANSFER ELEMENT AND PROCESS FOR FORMING ORGANIC ELECTROLUMINESCENT DEVICES

(75) Inventors: Martin B. Wolk, Woodbury; Paul F. Baude; Fred B. McCormick, both of Maplewood; Yong Hsu, Woodbury, all of MN (US)

(73) Assignee: 3M Innovative Properties, St. Paul, MN (US)

(*) Notice: Subject to any disclaimer, the term of this patent is extended or adjusted under 35 U.S.C. 154(b) by 0 days.

(21) Appl. No.: 09/662,078

(22) Filed: Sep. 14, 2000

Related U.S. Application Data

(60) Division of application No. 09/473,115, filed on Dec. 28, 1999, now Pat. No. 6,194,119, which is a continuation-in-part of application No. 09/231,723, filed on Nov. 5, 1999, now Pat. No. 6,114,088.

(51) Int. Cl.[7] .............................. G03F 7/34; H01J 17/00; H01J 17/42; H01J 61/00
(52) U.S. Cl. .............................. 430/14; 430/15; 430/200; 430/201; 430/319; 313/604; 313/606
(58) Field of Search .................................. 430/200, 319, 430/201, 14, 15; 313/604, 606

(56) References Cited

U.S. PATENT DOCUMENTS

| | | |
|---|---|---|
| 4,539,507 | 9/1985 | VanSlyke et al. . |
| 4,722,583 | 2/1988 | Stewart . |

(List continued on next page.)

FOREIGN PATENT DOCUMENTS

| | | |
|---|---|---|
| 321 923 | 7/1992 | (EP) . |
| 641 008 | 3/1995 | (EP) . |
| 851714 | * 7/1998 | (EP) . |
| 568 993 | 8/1998 | (EP) . |
| WO 00/14777 | 3/1900 | (WO) . |
| WO 9715173 | 4/1997 | (WO) . |
| WO 99/46961 | 9/1999 | (WO) . |

OTHER PUBLICATIONS

Pei, Quibing et al., "Polymer Light–Emitting Electrochemical Cells: In Situ Formation of a Light–Emitting p–n Junction", J. Am. Chem. Soc., vol. 118, No. 16, 1996, pp. 3922–3929.*

Halls, J.J.M., et al., "Light–emitting and photoconductive diodes fabricated with conjugated polymers", Thin Solid Films 276 (1996) pp. 13–20.*

Chen, C.H. et al., "Recent Developments in Molecular Organic Electroluminescent Materials", Macromol. Symp. 125, 1–48 (1997).*

Bello, Kasali A. et al., "Near–infrared–absorbing Squaraine Dyes containing 2,3–Dihydroperimidine Terminal Groups", J. Chem. Soc., Chem. Commun., 1993, pp. 452–454.*

Kido, Junji, "Organic Electroluminescent Devices Based on Polymeric Materials", TRIP vol. 2, No. 10, Oct. 1994, pp. 350–355.

*Primary Examiner*—Richard L. Schilling
(74) *Attorney, Agent, or Firm*—Robert J. Pechman

(57) ABSTRACT

Disclosed are thermal transfer elements and processes for patterning solvent-coated layers and solvent-susceptible layers onto the same receptor substrate. These donor elements and methods are particularly suited for making organic electroluminescent devices and displays. The donor elements can include a substrate, an optional light-to-heat conversion layer, and a single or multicomponent transfer layer that can be imagewise transferred to a receptor to form an organic electroluminescent device, portions thereof, or components therefor. The methods offer advantages over conventional patterning techniques such as photolithography, and make it possible to fabricate new organic electroluminescent device constructions.

3 Claims, 6 Drawing Sheets

U.S. PATENT DOCUMENTS

| | | |
|---|---|---|
| 4,833,124 | 5/1989 | Lum . |
| 4,912,083 | 3/1990 | Chapman et al. . |
| 4,940,640 | 7/1990 | MacDiarmid . |
| 4,942,141 | 7/1990 | DeBoer et al. . |
| 4,948,776 | 8/1990 | Evans et al. . |
| 4,948,778 | 8/1990 | DeBoer . |
| 4,950,639 | 8/1990 | DeBoer et al. . |
| 4,952,552 | 8/1990 | Chapman et al. . |
| 5,023,229 | 6/1991 | Evans et al. . |
| 5,024,990 | 6/1991 | Chapman et al. . |
| 5,061,569 | 10/1991 | VanSlyke et at. . |
| 5,141,671 | 8/1993 | Bryan et al. . |
| 5,156,938 | 10/1992 | Foley et al. . |
| 5,286,604 | 2/1994 | Simmons, III . |
| 5,340,699 | 8/1994 | Haley et al. . |
| 5,351,617 | 10/1994 | Williams et al. . |
| 5,360,694 | 11/1994 | Thien et al. . |
| 5,521,035 | 5/1996 | Wolk et al. . |
| 5,540,499 * | 7/1996 | Yamamoto et al. ............... 313/504 |
| 5,685,939 | 11/1997 | Wolk et al. . |
| 5,688,551 * | 11/1997 | Littman et al. ................... 430/200 |
| 5,707,745 | 1/1998 | Forrest et al. . |
| 5,725,989 | 3/1998 | Chang et al. . |
| 5,756,240 | 5/1998 | Roberts et al. . |
| 5,777,070 | 7/1998 | Inbasekaran et al. . |
| 5,869,199 * | 2/1999 | Kido et al. ....................... 313/504 |
| 5,876,864 * | 3/1999 | Kim et al. ........................ 313/504 |
| 5,904,961 * | 5/1999 | Tang et al. ....................... 430/200 |
| 5,937,272 | 8/1999 | Tang . |
| 5,998,085 * | 12/1999 | Isberg et al. ..................... 430/200 |
| 6,114,088 * | 9/2000 | Wolk et al. ...................... 430/200 |
| 6,140,009 * | 10/2000 | Wolk et al. ...................... 430/200 |

* cited by examiner

THERMAL TRANSFER ELEMENT AND PROCESS FOR FORMING ORGANIC ELECTROLUMINESCENT DEVICES

This is a divisional of application Ser. No. 09/473,115 filed Dec. 28, 1999, now U.S. Pat. No. 6,194,119, which is a continuation-in-part of U.S. patent application Ser. No. 09/231,723, filed Jan. 15, 1999, now U.S. Pat. No. 6,114,088 which is incorporated herein by reference.

The present invention relates to methods and materials for making and patterning organic electroluminescent devices as well as to organic electroluminescent devices so made and to displays employing organic electroluminescent devices.

BACKGROUND

Many miniature electronic and optical devices are formed using layers of different materials stacked on each other. These layers are often patterned to produce the devices. Examples of such devices include optical displays in which each pixel is formed in a patterned array, optical waveguide structures for telecommunication devices, and metal-insulator-metal stacks for semiconductor-based devices.

A conventional method for making these devices includes forming one or more layers on a receptor substrate and patterning the layers simultaneously or sequentially to form the device. In many cases, multiple deposition and patterning steps are required to prepare the ultimate device structure. For example, the preparation of optical displays may require the separate formation of red, green, and blue pixels. Although some layers may be commonly deposited for each of these types of pixels, at least some layers must be separately formed and often separately patterned. Patterning of the layers is often performed by photolithographic techniques that include, for example, covering a layer with a photoresist, patterning the photoresist using a mask, removing a portion of the photoresist to expose the underlying layer according to the pattern, and then etching the exposed layer.

In some applications, it may be difficult or impractical to produce devices using conventional photolithographic patterning. For example, the number of patterning steps may be too large for practical manufacture of the device. In addition, wet processing steps in conventional photolithographic patterning may adversely affect integrity, interfacial characteristics, and/or electrical or optical properties of the previously deposited layers. It is conceivable that many potentially advantageous device constructions, designs, layouts, and materials are impractical because of the limitations of conventional photolithographic patterning. There is a need for new methods of forming these devices with a reduced number of processing steps, particularly wet processing steps. In at least some instances, this may allow for the construction of devices with more reliability and more complexity.

SUMMARY OF THE INVENTION

The present invention provides new thermal transfer donor elements and methods of patterning using thermal transfer donor elements. The donors and methods of the present invention are particularly suited to patterning solvent-coated materials on the same substrate as solvent-susceptible materials. This can be especially useful in constructing organic electroluminescent displays and devices as well as components for organic electroluminescent displays and devices.

In one aspect, the present invention provides a method for making an organic electroluminescent device that includes the step of thermally transferring a light emitting polymer layer and a small molecule layer from one or more thermal transfer donor elements to a receptor so that the light emitting polymer layer and the small molecule layer are disposed between an anode and a cathode on the receptor.

In another aspect, the present invention provides a thermal transfer donor element for use in making organic electroluminescent devices that includes, in the following order, a substrate, a light-to-heat conversion layer, an interlayer, and a thermal transfer layer that has, in the following order, a release layer, a cathode layer, a light emitting polymer layer, a small molecule hole transport layer, and an anode layer.

In another aspect, the present invention provides a method for patterning a first material and a second material on a receptor, which method includes selectively thermal transferring the first material proximate to the second material on the receptor from a first donor element, the first material being formed on the donor element by solution coating using a solvent, the second material being incompatible with the solvent used to coat the first material, wherein at least one of the first and second materials is an organic electroluminescent material, an organic conductor, or an organic semiconductor.

In another aspect, the present invention provides a method for patterning materials that includes forming a donor element that has a substrate and a multicomponent thermal transfer layer, the thermal transfer layer having at least a first layer that includes a solvent-coated material and a second layer that includes a solvent susceptible material, the solvent-susceptible material being incompatible with the solvent used to coat the solvent-coated material, wherein the first layer is disposed between the second layer and the donor substrate. Next, the thermal transfer layer of the donor is placed proximate a receptor and the multicompolelit transfer layer is selectively thermally transferred from the donor element to the receptor. At least one of the solvent-coated material and the solvent-susceptible material is an organic electroluminescent material, an organic conductor, or an organic semiconductor.

In still another aspect, the present invention provides a method for patterning materials that includes the steps of thermally transferring selected portions of a first transfer layer from a first donor element to a receptor, the first transfer layer containing a first material, the first material being solution-coated from a solvent onto the first donor, and thermally transferring selected portions of a second transfer layer from a second donor element to the receptor, the second transfer layer containing a second material, the second material being incompatible with the solvent. At least one of the first and second materials is an organic electroluminescent material, an organic conductor, or an organic semiconductor.

In yet another aspect, the present invention provides a method for making a thermal transfer donor element, which method includes forming a donor element that has a donor substrate and a transfer layer, the transfer layer being formed by (a) solution coating a first material using a solvent, (b) drying the first material to substantially remove the solvent, and (c) depositing a second material such that the first material is disposed between the donor substrate and the second material, the second material being incompatible with the solvent used to coat the first material.

In another aspect, the present invention provides an organic electroluminescent display that includes a first organic electroluminescent device disposed on a display substrate, the first organic electroluminescent device having an emitter layer that is a light emitting polymer, and a second organic electroluminescent device disposed on the display substrate, the second organic electroluminescent device having an emitter layer that is an organic small molecule material.

In another aspect, the present invention provides an organic electroluminescent display that includes an organic electroluminescent device disposed on a display substrate, the organic electroluminescent device including, in the following order from the substrate, a first electrode, a small molecule charge transport layer, a polymer emitter layer, and a second electrode.

The above summary of the present invention is not intended to describe each disclosed embodiment or every implementation of the present invention. The Figures and the detailed description which follow more particularly exemplify these embodiments.

It should be understood that by specifying an order in the present document (e.g., order of steps to be performed, order of layers on a substrate, etc.), it is not meant to preclude intermediates between the items specified, as long as the items appear in the order as specified.

BRIEF DESCRIPTION OF THE DRAWINGS

The invention may be more completely understood in consideration of the following detailed description of various embodiments of the invention in connection with the accompanying drawings, in which.

Figure 1A:
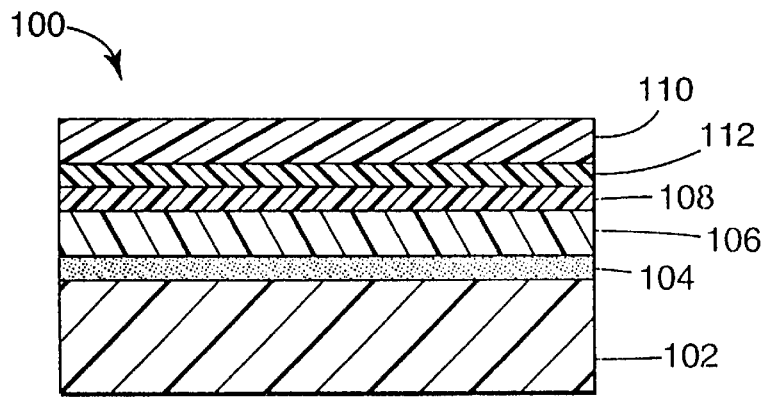
FIG. 1A is a schematic cross-section of one example of a thermal transfer element according to the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The present invention is applicable to the formation or partial formation of devices and other objects using thermal transfer processes and thermal transfer donor elements for forming the devices or other objects. As a particular example, a thermal transfer element can be formed for making, at least in part, an organic electroluminescent (OEL) device or array of devices, and components for use in OEL displays. This can be accomplished, for example, by thermal transfer of a single or a multicomponent transfer unit of a thermal transfer element. It will be recognized that single layer and multilayer transfers can be used to form other devices and objects. While the present invention is not so limited, an appreciation of various aspects of the invention will be gained through a discussion of the examples provided below.

Materials can be patterned onto substrates by selective thermal transfer of the materials from one or more thermal transfer elements. A thermal transfer element can be heated by application of directed heat on a selected portion of the thermal transfer element. Heat can be generated using a heating element (e.g., a resistive heating element), converting radiation (e.g., a beam of light) to heat, and/or applying an electrical current to a layer of the thermal transfer element to generate heat. In many instances, thermal transfer using light from, for example, a lamp or laser, is advantageous because of the accuracy and precision that can often be achieved. The size and shape of the transferred pattern (e.g., a line, circle, square, or other shape) can be controlled by, for example, selecting the size of the light beam, the exposure pattern of the light beam, the duration of directed beam contact with the thermal transfer element, and the materials of the thermal transfer element.

A thermal transfer element can include a transfer layer that can be used to form various elements and devices, or portions thereof Exemplary materials and transfer layers include those that can be used to form elements, devices, and portions thereof that are useful in electronic displays. While the examples used in the present invention most often focus on OEL devices and displays, transfer of materials from thermal transfer elements can also be used to form, at least in part, electronic circuitry, resistors, capacitors, diodes, rectifiers, electroluminescent lamps, memory elements, field effect transistors, bipolar transistors, unijunction transistors, MOS transistors, metal-insulator-semiconductor transistors, organic transistors, charge coupled devices, insulator-metal-insulator stacks, organic conductor-metal-organic conductor stacks, integrated circuits, photodetectors, lasers, lenses, waveguides, gratings, holographic elements, filters (e.g., add-drop filters, gain-flattening filters, cut-off filters, and the like), mirrors, splitters, couplers, combiners, modulators, sensors (e.g., evanescent sensors, phase modulation sensors, interferometric sensors, and the like), optical cavities, piezoelectric devices, ferroelectric devices, thin film batteries, or combinations thereof, for example, the combination of field effect transistors and organic electroluminescent lamps as an active matrix array for an optical display. Other items may be formed by transferring a multicomponent transfer unit and/or a single layer.

Thermal transfer using light can often provide better accuracy and quality control for very small devices, such as small optical and electronic devices, including, for example, transistors and other components of integrated circuits, as well as components for use in a display, such as electroluminescent lamps and control circuitry. Moreover, thermal transfer using light may, at least in some instances, provide for better registration when forming multiple devices over an area that is large compared to the device size. As an example, components of a display, which has many pixels, can be formed using this method.

In some instances, multiple thermal transfer elements may be used to form a device or other object, or to form adjacent devices, other objects, or portions thereof. The multiple thermal transfer elements may include thermal transfer elements with multicomponent transfer units and thermal transfer elements that transfer a single layer. For example, a device or other object may be formed using one or more thermal transfer elements with multicomponent transfer units and/or one or more thermal transfer elements that each can be used to transfer a single layer or a multilayer unit.

Thermal transfer of one or more layers to form a device or an array of devices can also be useful, for example, to reduce or eliminate wet processing steps of processes such as photolithographic patterning, which are used to form many electronic and optical devices. Thermal transfer to pattern layers from donor elements can also be useful to de-couple layer coating steps from patterning steps, for example where such coupling can limit the types of layered structures, or the types of adjacent structures, that can be patterned. In conventional patterning processes such as photolithography, ink-jet, screen printing, and various mask-based techniques, layers are typically coated directly onto the substrate on which patterning occurs. Patterning can take place simultaneously with coating (as for ink-jet, screen printing, and some mask-based processes) or subsequent to coating via etching or another removal technique. A difficulty with such conventional approaches is that solvents used to coat materials, and/or etching processes used to pattern materials, can damage, dissolve, penetrate, and/or render inoperable previously coated or patterned layers or materials.

In the present invention, materials can be coated onto thermal transfer donor elements to form the transfer layers of the donor elements. The transfer layer materials can then be patterned via selective thermal transfer from the donor to a receptor. Coating onto a donor followed by patterning via selective transfer represents a de-coupling of layer coating steps from patterning steps. An advantage of de-coupling coating and patterning steps is that materials can be patterned on top of or next to other materials that would be difficult to pattern, if possible at all, using conventional patterning processes. For example, in methods of the present invention a solvent-coated layer can be patterned on top of a solvent-susceptible material that would be dissolved, attacked, penetrated, and/or rendered inoperable for its intended purpose in the presence of the solvent had the solvent-coated layer been coated directly on the solvent-susceptible material.

A transfer layer of a donor element can be made by solvent-coating a first material on the donor, suitably drying the coating, and then depositing a second layer that includes material that may be susceptible to the solvent used to coat the first material. Damage to the second layer can be minimized or eliminated by evaporation, or otherwise removal, of much or most of the solvent before coating of the second layer. Upon thermal transfer of this multicomponent transfer layer from the donor element to a receptor, the second layer becomes positioned between the receptor and the solvent-coated first material. Thermal transfer of multiple layer units results in a reverse ordering of the transferred layers on the receptor relative to the ordering on the donor element. Because of this, solvent-susceptible layers can be pattered underneath solvent-coated layers. In addition, the layers need not be transferred together as a multiple layer unit. The solvent-susceptible material(s) can be patterned by any suitable method, including thermal transfer from a donor, followed by another thermal transfer step using another donor to transfer the solvent-coated material(s). The same holds for patterned thermal transfer of solvent-coated materials next to, but not necessarily in contact with, materials or layers on a receptor that may be incompatible with the solvent. As will be discussed in more detail below, the formation of OEL devices provides particularly suited examples.

With these general concepts of the present invention in mind, exemplary donor elements, thermal transfer methods, and devices made by thermal transfer methods will now be described.

One example of a suitable thermal transfer element 100 is illustrated in FIG. 1A. The thermal transfer element 100 includes a donor substrate 102, an optional primer layer 104, a light-to-heat conversion (LTHC) layer 106, an optional interlayer 108, an optional release layer 112, and a transfer layer 110. Directed light from a light-emitting source, such as a laser or lamp, can be used to illuminate the thermal transfer element 100 according to a pattern. The LTHC layer 106 contains a radiation absorber that converts light energy to heat energy. The conversion of the light energy to heat energy results in the transfer of a portion of the transfer layer 110 to a receptor (not shown).

Figure 1B:
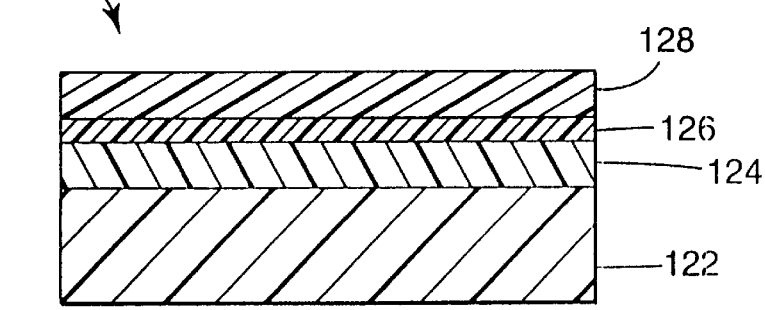
FIG. 1B is a schematic cross-section of a second example of a thermal transfer element according to the invention.
Figure 1C:
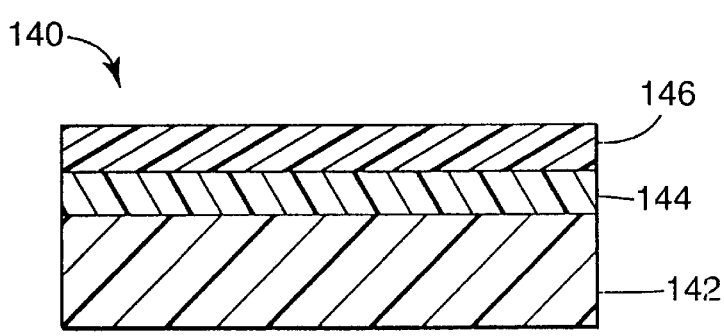
FIG. 1C is a schematic cross-section of a third example of a thermal transfer element according to the invention.
Figure 1D:
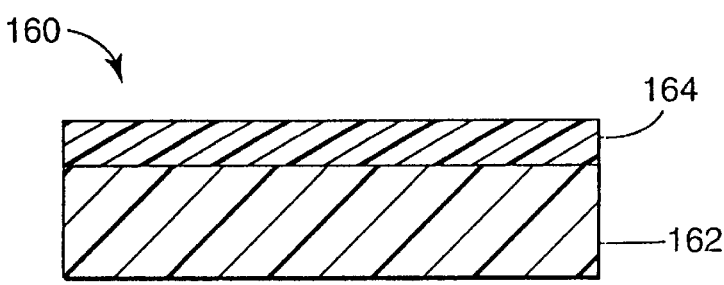
FIG. 1D is a schematic cross-section of a fourth example of a thermal transfer element according to the invention.

Another example of a thermal transfer element 120 includes a donor substrate 122, an LTHC layer 124, an interlayer 126, and a transfer layer 128, as illustrated in FIG. 1B. Another suitable thermal transfer element 140 includes a donor substrate 142, an LTHC layer 144, and a transfer layer 146, as illustrated in FIG. 1C. Yet another example of a thermal transfer element 160 includes a donor substrate 162 and a transfer layer 164, as illustrated in FIG. 1D, with an optional radiation absorber disposed in the donor substrate 162 and/or transfer layer 164 to convert light energy to heat energy. Alternatively, the thermal transfer element 160 may be used without a radiation absorber for thermal transfer of the transfer layer 164 using a heating element, such as a resistive heating element, that contacts the thermal transfer element to selectively heat the thermal transfer element and transfer the transfer layer according to a pattern. A thermal transfer element 160 without radiation absorber may optionally include a release layer, an interlayer, and/or other layers (e.g., a coating to prevent sticking of the resistive heating element) used in the art.

For thermal transfer using radiation (e.g., light), a variety of radiation-emitting sources can be used in the present invention. For analog techniques (e.g., exposure through a mask), high-powered light sources (e.g., xenon flash lamps and lasers) are useful. For digital imaging techniques, infrared, visible, and ultraviolet lasers are particularly useful. Suitable lasers include, for example, high power ($\leq 100$ mW) single mode laser diodes, fiber-coupled laser diodes, and diode-pumped solid state lasers (erg., Nd:YAG and Nd:YLF). Laser exposure dwell times can be in the range from, for example, about 0.1 to 100 microseconds and laser fluences can be in the range from, for example, about 0.01 to about 1 J/cm$^2$.

When high spot placement accuracy is required (e.g. for high information full color display applications) over large substrate areas, a laser is particularly useful as the radiation source. Laser sources are compatible with both large rigid substrates such as 1 m×1 m×1.1 mm glass, and continuous or sheeted film substrates, such as 100 $\mu$m polyimide sheets.

Resistive thermal print heads or arrays may be used, for example, with simplified donor film constructions lacking an LTHC layer and radiation absorber. This may be particularly useful with smaller substrate sizes (e.g., less than approximately 30 cm in any dimension) or for larger patterns, such as those required for alphanumeric segmented displays.

During imaging, the thermal transfer element is typically brought into intimate contact with a receptor. In at least some instances, pressure or vacuum are used to hold the thermal transfer element in intimate contact with the receptor. A radiation source is then used to heat the LTHC layer (and/or other layer(s) containing radiation absorber) in an imagewise fashion (e.g., digitally or by analog exposure through a mask) to perform imagewise transfer of the transfer layer from the thermal transfer element to the receptor according to a pattern.

Alternatively, a heating element, such as a resistive heating element, may be used to transfer the multicomponent transfer unit. The thermal transfer element is selectively contacted with the heating element to cause thermal transfer of a portion of the transfer layer according to a pattern. In another embodiment, the thermal transfer element may include a layer that can convert an electrical current applied to the layer into heat.

Typically, the transfer layer is transferred to the receptor without transferring any of the other layers of the thermal transfer element, such as the optional interlayer and the LTHC layer. The presence of the optional interlayer may eliminate or reduce the transfer of the LTHC layer to the receptor and/or reduce distortion in the transferred portion of the transfer layer. Preferably, under imaging conditions, the adhesion of the interlayer to the LTHC layer is greater than the adhesion of the interlayer to the transfer layer. In some instances, a reflective or an absorptive interlayer can be used to attenuate the level of imaging radiation transmitted through the interlayer and reduce any damage to the transferred portion of the transfer layer that may result from interaction of the transmitted radiation with the transfer layer and/or the receptor. This is particularly beneficial in reducing thermal damage which may occur when the receptor is highly absorptive of the imaging radiation.

Large thermal transfer elements can be used, including thermal transfer elements that have length and width dimensions of a meter or more. In operation, a laser can be rastered or otherwise moved across the large thermal transfer element, the laser being selectively operated to illuminate portions of the thermal transfer element according to a desired, pattern. Alternatively, the laser may be stationary and the thermal transfer element moved beneath the laser.

Thermal transfer donor substrates can be polymer films. One suitable type of polymer film is a polyester film, for example, polyethylene terephthalate or polyethylene naphthalate films. However, other films with sufficient optical properties (if light is used for heating and transfer), including high transmission of light at a particular wavelength, as well as sufficient mechanical and thermal stability for the particular application, can be used. The donor substrate, in at least some instances, is flat so that uniform coatings can be formed thereon. The donor substrate is also typically selected from materials that remain stable despite heating of the LTHC layer. The typical thickness of the donor substrate ranges from 0.025 to 0.15 mm, preferably 0.05 to 0.1 mm, although thicker or thinner donor substrates may be used.

Typically, the materials used to form the donor substrate and the LTHC layer are selected to improve adhesion between the LTHC layer and the donor substrate. An optional priming layer can be used to increase uniformity during the coating of subsequent layers and also increase the interlayer bonding strength between the LTHC layer and the donor substrate. One example of a suitable substrate with primer layer is available from Teijin Ltd. (Product No. HPE100, Osaka, Japan).

For radiation-induced thermal transfer a light-to-heat conversion (LTHC) layer is typically incorporated within the thermal transfer element to couple the energy of light radiated from a light-emitting source into the thermal transfer element. The LTHC layer preferably includes a radiation absorber that absorbs incident radiation (e.g., laser light) and converts at least a portion of the incident radiation into heat to enable transfer of the transfer layer from the thermal transfer element to the receptor. In some embodiments, there is no separate LTHC layer and, instead, the radiation absorber is disposed in another layer of the thermal transfer element, such as the donor substrate or the transfer layer. In other embodiments, the thermal transfer element includes an LTHC layer and also includes additional radiation absorber (s) disposed in one or more of the other layers of the thermal transfer element, such as, for example, the donor substrate or the transfer layer. In yet other embodiments, the thermal transfer element does not include an LTHC layer or radiation absorber and the transfer layer is transferred using a heating element that contacts the thermal transfer element.

Typically, the radiation absorber in the LTHC layer (or other layers) absorbs light in the infrared, visible, and/or ultraviolet regions of the electromagnetic spectrum. The radiation absorber is typically highly absorptive of the selected imaging radiation, providing an optical density at the wavelength of the imaging radiation in the range of 0.2 to 3, and preferably from 0.5 to 2. Suitable radiation absorbing materials can include, for example, dyes (e.g., visible dyes, ultraviolet dyes, infrared dyes, fluorescent dyes, and radiation-polarizing dyes), pigments, metals, metal compounds, metal films, and other suitable absorbing materials. Examples of suitable radiation absorbers can include carbon black, metal oxides, and metal sulfides. One example of a suitable LTHC layer can include a pigment, such as carbon black, and a binder, such as an organic polymer. Another suitable LTHC layer can include metal or metal/metal oxide formed as a thin film, for example, black aluminum (i.e., a partially oxidized aluminum having a black visual appearance). Metallic and metal compound films may be formed by techniques, such as, for example, sputtering and evaporative deposition. Particulate coatings may be formed using a binder and any suitable dry or wet coating techniques.

Radiation absorber material can be uniformly disposed throughout the LTHC layer or can be non-homogeneously distributed. For example, as described in co-assigned U.S. patent application Ser. No. 09/474,002 entitled "Thermal Mass Transfer Donor Elements", the disclosure of which is wholly incorporated into this document, non-homogeneous LTHC layers can be used to control temperature profiles in donor elements. This can give rise to thermal transfer elements that have higher transfer sensitivities (e.g., better fidelity between the intended transfer patterns and actual transfer patterns).

Dyes suitable for use as radiation absorbers in an LTHC layer may be present in particulate form, dissolved in a binder material, or at least partially dispersed in a binder material. When dispersed particulate radiation absorbers are used, the particle size can be, at least in some instances, about 10 $\mu$m or less, and may be about 1 $\mu$m or less. Suitable dyes include those dyes that absorb in the IR region of the spectrum. Examples of such dyes may be found in Matsuoka, M., "Infrared Absorbing Materials", Plenum Press, New York, 1990; Matsuoka, M., *Absorption Spectra of Dyes for Diode Lasers*, Bunshin Publishing Co., Tokyo, 1990, U.S. Pat. Nos. 4,722,583; 4,833,124; 4,912,083; 4,942,141; 4,948,776; 4,948,778; 4,950,639; 4,940,640; 4,952,552; 5,023,229; 5,024,990; 5,156,938; 5,286,604; 5,340,699; 5,351,617; 5,360,694; and 5,401,607; European Patent Nos. 321,923 and 568,993; and Beilo, K. A. et al., *J. Chem. Soc. Chem. Commun.*,1993, 452–454 (1993), all of which are herein incorporated by reference. IR absorbers marketed by Glendale Protective Technologies, Inc., Lakeland, Fla., under the designation CYASORB IR-99, IR-126 and IR-165 may also be used. A specific dye may be chosen based on factors such as, solubility in, and compatibility with, a specific binder and/or coating solvent, as well as the wavelength range of absorption.

Pigmentary materials may also be used in the LTHC layer as radiation absorbers. Examples of suitable pigments include carbon black and graphite, as well as phthalocyanines, nickel dithiolenes, and other pigments described in U.S. Pat. Nos. 5,166,024 and 5,351,617, incorporated herein by reference. Additionally, black azo pigments based on copper or chromium complexes of, for example, pyrazolone yellow, dianisidine red, and nickel azo yellow can be useful. Inorganic pigments can also be used, including, for example, oxides and sulfides of metals such as aluminum, bismuth, tin, indium, zinc, titanium, chromium, molybdenum, tungsten, cobalt, iridium, nickel, palladium, platinum, copper, silver, gold, zirconium, iron, lead, and tellurium. Metal borides, carbides, nitrides, carbonitrides, bronze-structured oxides, and oxides structurally related to the bronze family (e.g., $WO_{2.9}$) may also be used.

Metal radiation absorbers may be used, either in the form of particles, as described for instance in U.S. Pat. No. 4,252,671, incorporated herein by reference, or as films, as disclosed in U.S. Pat. No. 5,256,506, incorporated herein by reference. Suitable metals include, for example, aluminum, bismuth, tin, indium, tellurium and zinc.

As indicated, a particulate radiation absorber may be disposed in a binder. The weight percent of the radiation absorber in the coating, excluding the solvent in the calculation of weight percent, is generally from 1 wt. % to 30 wt. %, preferably from 3 wt. % to 20 wt. %, and most preferably from 5 wt. % to 15 wt. %, depending on the particular radiation absorber(s) and binder(s) used in the LTHC.

Suitable binders for use in the LTHC layer include film-forming polymers, such as, for example, phenolic resins (e.g., novolak and resole resins), polyvinyl butyral resins, polyvinyl acetates, polyvinyl acetals, polyvinylidene chlorides, polyacrylates, cellulosic ethers and esters, nitrocelluloses, and polycarbonates. Suitable binders may include monomers, oligomers, or polymers that have been or can be polymerized or crosslinked. In some embodiments, the binder is primarily formed using a coating of crosslinkable monomers and/or oligomers with optional polymer. When a polymer is used in the binder, the binder includes 1 to 50 wt. %, preferably, 10 to 45 wt. %, polymer (excluding the solvent when calculating wt. %).

Upon coating on the donor substrate, the monomers, oligomers, and polymers may be crosslinked to form the LTHC. In some instances, if crosslinking of the LTHC layer is too low, the LTHC layer may be damaged by the heat and/or permit the transfer of a portion of the LTHC layer to the receptor with the transfer layer.

The inclusion of a thermoplastic resin (e.g., polymer) may improve, in at least some instances, the performance (e.g., transfer properties and/or coatability) of the LTHC layer. It is thought that a thermoplastic resin may improve the adhesion of the LTHC layer to the donor substrate. In one embodiment, the binder includes 25 to 50 wt. % (excluding the solvent when calculating weight percent) thermoplastic resin, and, preferably, 30 to 45 wt. % thermoplastic resin, although lower amounts of thermoplastic resin may be used (e.g., 1 to 15 wt. %). The thermoplastic resin is typically chosen to be compatible (i.e., form a one-phase combination) with the other materials of the binder. A solubility parameter can be used to indicate compatibility, *Polymer Handbook*, J. Brandrup, ed., pp. VII 519–557 (1989), incorporated herein by reference. In at least some embodiments, a thermoplastic resin that has a solubility parameter in the range of 9 to 13 $(cal/cm^3)^{1/2}$, preferably, 9.5 to 12 $(cal/cm^3)^{1/2}$, is chosen for the binder. Examples of suitable thermoplastic resins include polyacrylics, styrene-acrylic polymers and resins, and polyvinyl butyral, Conventional coating aids, such as surfactants and dispersing agents, may be added to facilitate the coating process. The LTHC layer may be coated onto the donor substrate using a variety of coating methods known in the art. A polymeric or organic LTHC layer is coated, in at least some instances, to a thickness of 0.05 $\mu$m to 20 $\mu$m, preferably, 0.5 $\mu$m to 10 $\mu$m, and, most preferably, 1 $\mu$m to 7 $\mu$m. An inorganic LTHC layer is coated, in at least some instances, to a thickness in the range of 0.001 to 10 $\mu$m, and preferably, 0.002 to 1 $\mu$m.

An optional interlayer may be disposed between the LTHC layer and transfer layer in thermal transfer elements to minimize damage and contamination of the transferred portion of the transfer layer and may also reduce distortion in the transferred portion of the transfer layer. The interlayer may also influence the adhesion of the transfer layer to the rest of the thermal transfer element. Typically, the interlayer has high thermal resistance. Preferably, the interlayer does not distort or chemically decompose under the imaging conditions, particularly to an extent that renders the transferred image non-functional. The interlayer typically remains in contact with the LTHC layer during the transfer process and is not substantially transferred with the transfer layer.

Suitable interlayers include, for example, polymer films, metal layers (e.g., vapor deposited metal layers), inorganic layers (e.g., sol-gel deposited layers and vapor deposited layers of inorganic oxides (e.g., silica, titania, and other metal oxides)), and organic/inorganic composite layers. Organic materials suitable as interlayer materials include both thermoset and thermoplastic materials. Suitable thermoset materials include resins that may be crosslinked by heat, radiation, or chemical treatment including, but not limited to, crosslinked or crosslinkable polyacrylates, polymethacrylates, polyesters, epoxies, and polyurethanes. The thermoset materials may be coated onto the LTHC layer as, for example, thermoplastic precursors and subsequently crosslinked to form a crosslinked interlayer.

Suitable thermoplastic materials include, for example, polyacrylates, polymethacrylates, polystyrenes, polyurethanes, polysulfones, polyesters, and polyimides. These thermoplastic organic materials may be applied via conventional coating techniques (for example, solvent coating, spray coating, or extrusion coating). Typically, the glass transition temperature ($T_g$) of thermoplastic materials suitable for use in the interlayer is 25° C. or greater, preferably 50° C. or greater, more preferably 100° C. or greater, and, most preferably, 1 50° C. or greater. The interlayer may be either transmissive, absorbing, reflective, or some combination thereof, at the imaging radiation wavelength.

Inorganic materials suitable as interlayer materials include, for example, metals, metal oxides, metal sulfides, and inorganic carbon coatings, including those materials that are highly transmissive or reflective at the imaging light wavelength. These materials may be applied to the light-to-heat-conversion layer via conventional techniques (e.g., vacuum sputtering, vacuum evaporation, or plasma jet deposition).

The interlayer may provide a number of benefits. The interlayer may be a barrier against the transfer of material from the light-to-heat conversion layer. It may also modulate the temperature attained in the transfer layer so that thermally unstable materials can be transferred. The presence of an interlayer may also result in improved plastic memory in the transferred material.

The interlayer may contain additives, including, for example, photoinitiators, surfactants, pigments, plasticizers, and coating aids. The thickness of the interlayer may depend on factors such as, for example, the material of the interlayer, the material of the LTHC layer, the material of the transfer layer, the wavelength of the imaging radiation, and the duration of exposure of the thermal transfer element to imaging radiation. For polymer interlayers, the thickness of the interlayer typically is in the range of 0.05 $\mu$m to 10 $\mu$m, preferably, from about 0.1 $\mu$m to 4 $\mu$m, more preferably, 0.5 to 3 $\mu$m, and, most preferably, 0.8 to 2 $\mu$m. For inorganic interlayers (e.g., metal or metal compound interlayers), the thickness of the interlayer typically is in the range of 0.005 $\mu$m to 10 $\mu$m, preferably, from about 0.01 $\mu$m to 3 $\mu$m, and, more preferably, from about 0.02 to 1 $\mu$m.

Thermal transfer elements can include an optional release layer. The optional release layer typically facilitates release of the transfer layer from the rest of the thermal transfer element (e.g., the interlayer and/or the LTHC layer) upon heating of the thermal transfer element, for example, by a light-emitting source or a heating element. In at least some cases, the release layer provides some adhesion of the transfer layer to the rest of the thermal transfer element prior to exposure to heat. Suitable release layers include, for example, conducting and non-conducting thermoplastic polymers, conducting and non-conducting filled polymers, and/or conducting and non-conducting dispersions. Examples of suitable polymers include acrylic polymers, polyanilines, polythiophenes, poly(phenylenevinylenes), polyacetylenes, and other conductive organic materials, such as those listed in *Handbook of Conductive Molecules and Polymers*. Vols. 1–4, H. S. Nalwa, ed., John Wiley and Sons, Chichester (1997), incorporated herein by reference. Examples of suitable conductive dispersions include inks containing carbon black, graphite, ultrafine particulate indium tin oxide, ultrafine antimony tin oxide, and commercially available materials from companies such as Nanophase Technologies Corporation (Burr Ridge, Ill.) and Metech (Elverson, Pa.). Other suitable materials for the release layer include sublimable insulating materials and sublimable semiconducting materials (such as phthalocyanines), including, for example, the materials described in U.S. Pat. No. 5,747,217, incorporated herein by reference.

The release layer may be part of the transfer layer or a separate layer. All or a portion of the release layer may be transferred with the transfer layer. Alternatively, most or substantially all of the release layer can remain with the donor substrate when the transfer layer is transferred. In some instances, for example with a release layer that includes a sublimable material, a portion of the release layer may be dissipated during the transfer process.

The transfer layers of thermal transfer elements of the present invention can include one or more layers for transfer to a receptor. These one or more layers may be formed using organic, inorganic, organometallic, and other materials. Although the transfer layer is described and illustrated as having one or more discrete layers, it will be appreciated that, at least in some instances where more than one layer is used, there may be an interfacial region that includes at least a portion of each layer. This may occur, for example, if there is mixing of the layers or diffusion of material between the layers before, during, or after transfer of the transfer layer. In other instances, individual layers may be completely or partially mixed before, during, or after transfer of the transfer layer. In any case, these structures will be referred to as including more than one independent layer, particularly if different functions of the device are performed by the different regions.

One advantage of using a multicomponent transfer unit, particularly if the layers do not mix, is that the important interfacial characteristics of the layers in the multicomponent transfer unit can be produced when the thermal transfer unit is prepared and, preferably, retained during transfer.

One example of a transfer layer includes a single or multicomponent transfer unit that is used to form at least part of a multilayer device, such as an OEL device, or another device used in connection with OEL devices, on a receptor. In some cases, the transfer layer may include all of the layers needed to form an operative device. In other cases, the transfer layer may include fewer than all the layers needed to form an operative device, the other layers being formed via transfer from one or more other donor elements or via some other suitable transfer or patterning method. In still other instances, one or more layers of a device may be provided on the receptor, the remaining layer or layers being included in the transfer layer of one or more donor elements. Alternatively, one or more additional layers of a device may be transferred onto the receptor after the transfer layer has been patterned. In some instances, the transfer layer is used to form only a single layer of a device.

In one embodiment, an exemplary transfer layer includes a multicomponent transfer unit that is capable of forming at least two layers of a multilayer device. These two layers of the multilayer device often correspond to two layers of the transfer layer. In this example, one of the layers that is formed by transfer of the multicomponent transfer unit can be an active layer (i.e., a layer that acts as a conducting, semiconducting, electron blocking, hole blocking, light producing (e.g., luminescing, light emitting, fluorescing, or phosphorescing), electron producing, or hole producing layer). A second layer that is formed by transfer of the multicomponent transfer unit can be another active layer or an operational layer (i.e., a layer that acts as an insulating, conducting, semiconducting, electron blocking, hole blocking, light producing, electron producing, hole producing, light absorbing, reflecting, diffracting, phase retarding, scattering, dispersing, or diffusing layer in the device). The second layer can also be a non-operational layer (i.e., a layer that does not perform a function in the operation of the device, but is provided, for example, to facilitate transfer and/or adherence of the transfer unit to the receptor substrate during patterning). The multicomponent transfer unit may also be used to form additional active layers, operational layers, and/or non-operational layers The transfer layer may include an adhesive layer disposed on an outer surface of the transfer layer to facilitate adhesion to the receptor. The adhesive layer may be an operational layer, for example, if the adhesive layer conducts electricity between the receptor and the other layers of the transfer layer, or a non-operational layer, for example, if the adhesive layer only adheres the transfer layer to the receptor. The adhesive layer may be formed using, for example, thermoplastic polymers, including conducting and non-conducting polymers, conducting and non-conducting filled polymers, and/or conducting and non-conducting dispersions. Examples of suitable polymers include acrylic polymers, polyanilines, polythiophenes, poly(phenylenevinylenes), polyacetylenes, and other conductive organic materials such as those listed in *Handbook of Conductive Molecules and Polymers, Vols.* 1–4, H. S. Nalwa, ed., John Wiley and Sons, Chichester (1997), incorporated herein by reference. Examples of suitable conductive dispersions include inks containing carbon black, graphite, carbon nanotubes, ultrafine particulate indium tin oxide, ultrafine antimony tin oxide, and commercially available materials from companies such as Nanophase Technologies Corporation (Burr Ridge, Ill.) and Metech (Elverson, Pa.). Conductive adhesive layers can also include vapor or vacuum deposited organic conductors such as N,N'-bis(1-naphthyl)-N,N'-diphenylbenzidine (also known as NPB).

The transfer layer may also include a release layer disposed on the surface of the transfer layer that is in contact with the rest of the thermal transfer element. As described above, this release layer may partially or completely transfer with the remainder of the transfer layer, or substantially all of the release layer may remain with the thermal transfer element, or the release layer may dissipate in whole or in part, upon transfer of the transfer layer. Suitable release layers are described above.

Although the transfer layer may be formed with discrete layers, it will be understood that, in at least some embodiments, the transfer layer may include layers that have multiple components and/or multiple uses in the device. It will also be understood that, at least in some embodiments, two or more discrete layers may be melted together during transfer or otherwise mixed or combined. In any case, these layers, although mixed or combined, will be referred to as individual layers.

Figure 2A:
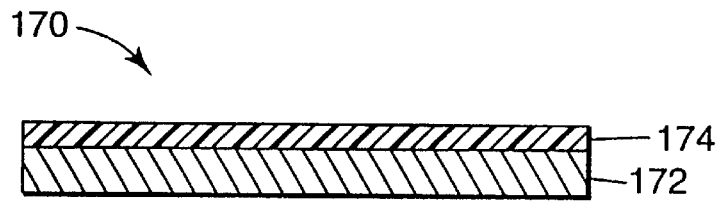
FIG. 2A is a schematic cross-section of a first example of a transfer layer, according to the invention, for use in any of the thermal transfer elements of FIGS. 1A to 1D.

One example of a transfer layer 170, illustrated in FIG. 2A, includes a conductive metal or metal compound layer 172 and a conductive polymer layer 174. Transfer layer 170 may be arranged so that either layer 172 or layer 174 is the outer layer of the donor (i.e., layer for contacting receptor (not shown) upon transfer). The conductive polymer layer 174 may also act, at least in part, as an adhesive layer to facilitate transfer to the receptor or elements or layers previously formed on the receptor when the conductive polymer layer 174 is the outer layer.

Figure 2B:
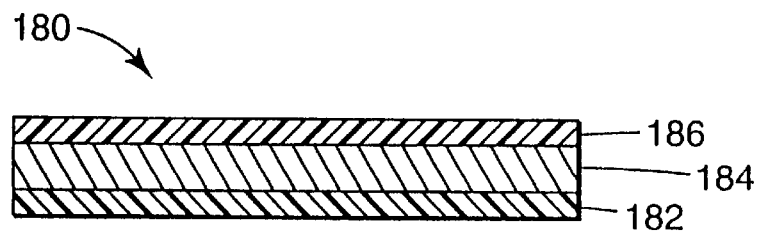
FIG. 2B is a schematic cross-section of a second example of a transfer layer, according to the invention, for use in any of the thermal transfer elements of FIGS 1A to 1D.

A second example of a transfer layer 180, illustrated in FIG. 2B, includes a release layer 182, followed by a conductive metal or metal compound layer 184, and then a conductive or non-conductive polymer layer 186 for contact with a receptor (not shown). In other embodiments, the ordering of layers 184 and 186 can be reversed so that layer 184 is the outer layer.

Figure 2C:
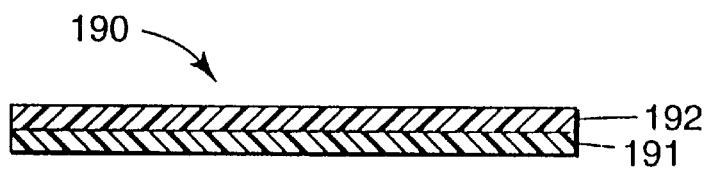
FIG. 2C is a schematic cross-section of a third example of a transfer layer, according to the invention, for use in any of the thermal transfer elements of FIGS. 1A to 1D.

A third example of a transfer layer 190, illustrated in FIG. 2C, includes a conductive inorganic layer 191 (for example, vapor deposited indium tin oxide), a conductive or non-conductive polymer layer 192, and an optional release layer (not shown). Either layer 191 or layer 192 can be the outer layer.

Figure 2D:
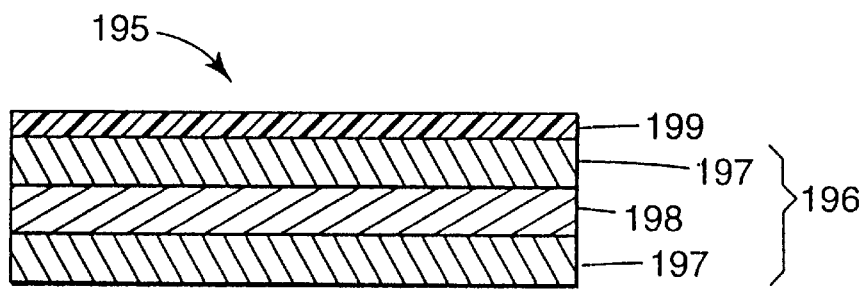
FIG. 2D is a schematic cross-section of a fourth example of a transfer layer, according to the invention, for use in any of the thermal transfer elements of FIGS. 1A to 1D.

A fourth example of a transfer layer 195, illustrated in FIG. 2D, consists of a multilayer metal stack 196 of alternating metals 197, 198, such as gold-aluminum-gold, and a conductive or non-conductive polymer layer 199 for contact with a receptor.

Figure 2E:
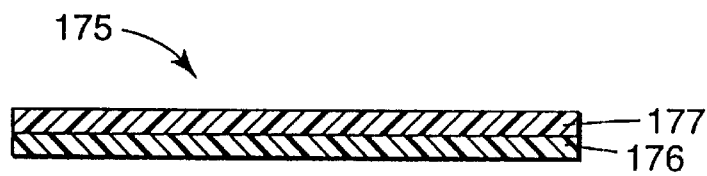
FIG. 2E is a schematic cross-section of a fifth example of a transfer layer, according to the invention, for use in any of the thermal transfer elements of FIGS. 1A to 1D.

A fifth example of a transfer layer 175, illustrated in FIG. 2E, includes a solvent-coated layer 176 and an adjacent layer 177 that is susceptible to the solvent used to coat layer 176. Layer 177 can be formed on solvent-coated layer 176 after layer solvent-coated 176 is coated onto the donor element, and preferably dried to substantially remove the solvent. Transfer layer 175 can include additional layers (not shown) disposed above layer 177, below layer 176, or between layers 176 and 177, including release and adhesion layers. When transfer layer 175 is transferred to receptor (not shown), layer 177 will be disposed between the receptor and solvent-coated layer 176, The transfer of a one or more single or multicomponent transfer units to form at least a portion of an OEL (organic electroluminescent) device provides a particularly illustrative, non-limiting example of the formation of an active device using a thermal transfer element. In at least some instances, an OEL device includes a thin layer, or layers, of one or more suitable organic materials sandwhiched between a cathode and an anode. Electrons are injected into the organic layer(s) from the cathode and holes are injected into the organic layer(s) from the anode. As the injected charges migrate towards the oppositely charged electrodes, they may recombine to form electron-hole pairs which are typically referred to as excitons. These excitons, or excited state species, may emit energy in the form of light as they decay back to a ground state (see, for example, T. Tsutsui, *MRS Bulletin,* 22, 39–45 (1997), incorporated herein by reference).

Illustrative examples of OEL device constructions include molecularly dispersed polymer devices where charge carrying and/or emitting species are dispersed in a polymer matrix (see J. Kido "Organic Electroluminescent devices Based on Polymeric Materials", *Trends in Polymer Science,* 2, 350–355 (1994), incorporated herein by reference), conjugated polymer devices where layers of polymers such as polyphenylene vinylene act as the charge carrying and emitting species (see J. J. M. Halls et al., *Thin Solid Films,* 276, 13–20 (1996), herein incorporated by reference), vapor deposited small molecule heterostructure devices (see U.S. Pat. No. 5,061,569 and C. H. Chen et al., "Recent Developments in Molecular Organic Electroluminescent Materials", *Macromolecular Symposia,* 125, 1–48 (1997), herein incorporated by reference), light emitting electrochemical cells (see Q. Pei et al., *J. Amer. Chem. Soc.,* 118, 3922–3929 (1996), herein incorporated by reference), and vertically stacked organic light-emitting diodes capable of emitting light of multiple wavelengths (see U.S. Pat. No.

5,707,745 and Z. Shen et al., *Science,* 276, 2009–2011 (1997), herein incorporated by reference).

As used herein, the term "small molecule" refers to a non-polymeric organic, inorganic, or organometallic molecule, and the term "organic small molecule" refers to a non-polymer organic or organometallic molecule. In OEL devices, small molecule materials can be used as emitter layers, as charge transport layers, as dopants in emitter layers (e.g., to control the emitted color) or charge transport layers, and the like.

Figure 3A:
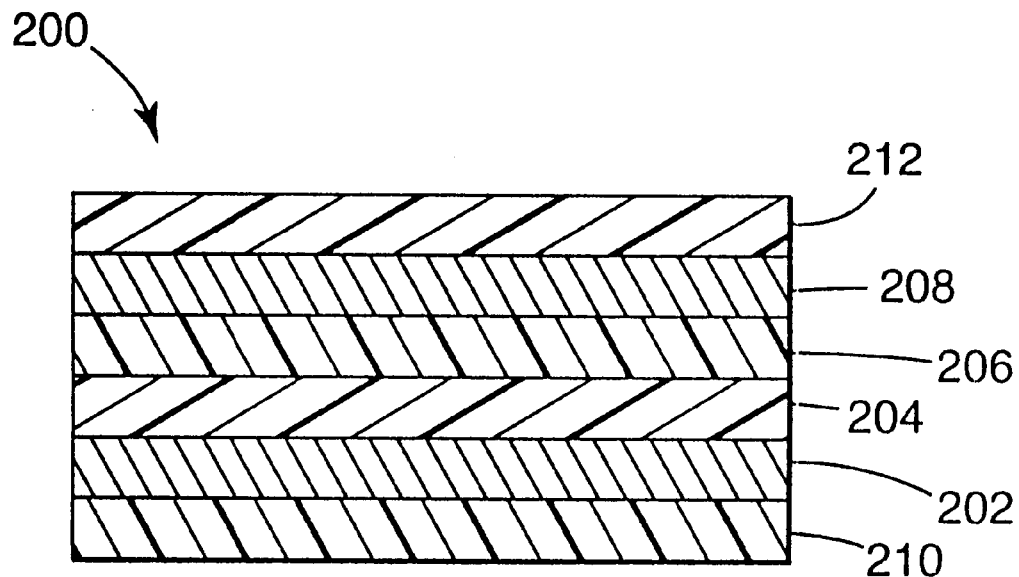
FIG. 3A is a schematic cross-section of an example of a transfer layer, according to the invention, for use in forming an organic electroluminescent device.
Figure 3B:
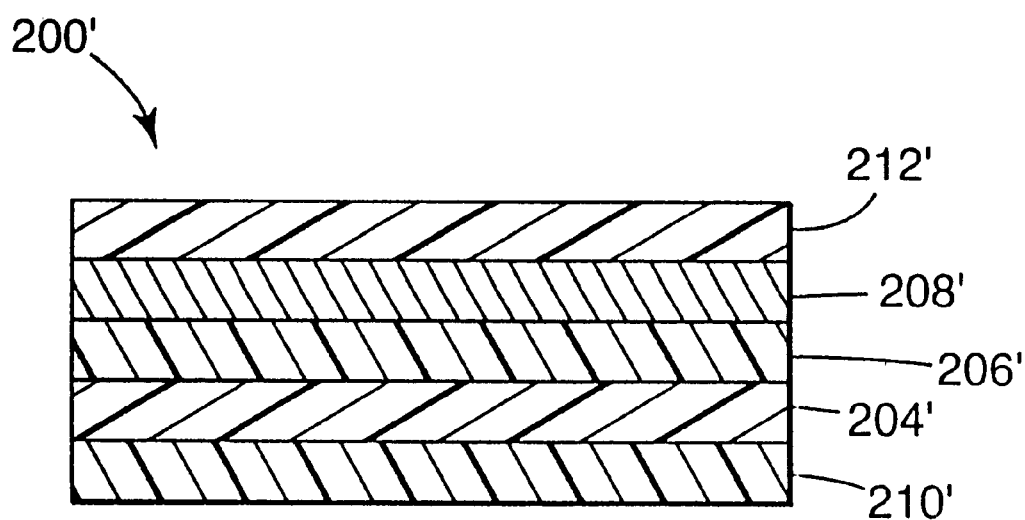
FIG. 3B is a schematic cross-section of a second example of a transfer layer, according to the invention, for use in forming an organic electroluminescent device.

One suitable example of a transfer layer 200 for forming an OEL device is illustrated in FIG. 3A. The transfer layer 200 includes an anode 202, an optional hole transport layer 204, an electron transport/emitter layer 206, and a cathode 208. A separate electron transport layer (not shown) can be included between emitter layer 206 and cathode 208. Also, a separate electron blocking layer (not shown) can be included between the emitter layer and the anode, and a separate hole blocking layer (not shown) can be included between the emitter layer and the cathode. Alternatively, either the cathode or anode can be provided separately on a receptor (e.g., as a conductive coating on the receptor, or as patterned conductive stripes or pads on the receptor) and not in the transfer layer. This is illustrated in FIG. 3B, for an anode-less transfer layer 200' using primed reference numerals to indicate layers in common with the transfer layer 200.

The transfer layer 200 may also include one or more layers, such as a release layer 210 and/or an adhesive layer 212, to facilitate the transfer of the transfer layer to the receptor. Either of these two layers can be conductive polymers to facilitate electrical contact with a conductive layer or structure on the receptor or conductive layer(s) formed subsequently on the transfer layer. It will be understood that the positions of the release layer and adhesive layer could be switched with respect to the other layers of the transfer layer so that the transfer layer 200 can be transferred with either the anode or the cathode disposed proximate to the receptor surface.

For many applications, such as display applications, it is preferred that at least one of the cathode and anode be transparent to the light emitted by the electroluminescent device. This depends on the orientation of the device (i.e, whether the anode or the cathode is closer to the receptor substrate) as well as the direction of light emission (i.e., through the receptor substrate or away from the receptor substrate).

The anode 202 and cathode 208 are typically formed using conducting materials such as metals, alloys, metallic compounds, metal oxides, conductive ceramics, conductive dispersions, and conductive polymers, including, for example, gold, platinum, palladium, aluminum, titanium, titanium nitride, indium tin oxide (ITO), fluorine tin oxide (FTO), and polyaniline. The anode 202 and the cathode 208 can be single layers of conducting materials or they can include multiple layers. For example, an anode or a cathode may include a layer of aluminum and a layer of gold, a layer of aluminum and a layer of lithium fluoride, or a metal layer and a conductive organic layer. It may be particularly useful to provide a two-layer cathode (or anode) consisting of a conductive organic layer (e.g., 0.1 to 5 microns thick) and a thin metal or metal compound layer (e.g., 100 to 1000 Angstroms). Such a bilayer electrode construction may be more resistant moisture or oxygen that can damage underlying moisture- or oxygen-sensitive layers in a device (e.g., organic light emitting layers). Such damage can occur when there are pinholes in the thin metal layer, which can be covered and sealed by the conductive organic layer. Damage and/or device failure can be caused by cracking or fracturing of the thin metal layer. Addition of a conductive organic layer can make the metal layer more resistant to fracture, or can act as a diffusion barrier against corrosive substances and as a conductive bridge when fracturing occurs.

The hole transport layer 204 facilitates the injection of holes into the device and their migration towards the cathode 208. The hole transport layer 204 can further act as a barrier for the passage of electrons to the anode 202. The hole transport layer 204 can include, for example, a diamine derivative, such as N,N'-bis(3-methylphenyl)-N,N'-diphenylbenzidine (also known as TPD) or other hole conductive materials such as NPB. In general, the hold transport layer can include organic small molecule materials, conductive polymers, a polymer matrix doped with an organic small molecule, and other suitable organic or inorganic conductive or semiconductive materials.

The electron transport/emitter layer 206 facilitates the injection of electrons and their migration towards the anode 202. The electron transport/emitter layer 206 can further act as a barrier for the passage of holes to the cathode 208. The electron transport/emitter layer 206 is often formed from a metal chelate compound, such as, for example, tris(8-hydroxyquinoline) aluminum (ALQ). Emitter layers (and/or electron transport layers) can also include light emitting polymers such as poly(phenylenevinylene)s (PPVs), poly-para-phenylens (PPPs), and polyfluorenes (PFs); organic small molecule materials, of which ALQ is an example; polymers doped with organic small molecules; and other suitable materials.

The interface between the hole transport layer 204 and electron transport/emitter layer 206 forms a barrier for the passage of holes and electrons and thereby creates a hole/electron recombination zone and provides an efficient organic electroluminescent device. When the emitter material is ALQ, the OEL device emits blue-green light. The emission of light of different colors may be achieved by the use of different emitters and dopants in the electron transport/emitter layer 206 (see C. H. Chen et al., "Recent Developments in Molecular Organic Electroluminescent Materials", *Macromolecular Symposia,* 125, 1–48 (1997), herein incorporated by reference).

Other OEL multilayer device constructions may be transferred using different transfer layers. For example, the hole transporting layer 204 in FIG. 3A could also be an emitter layer and/or the hole transporting layer 204 and the electron transporting/emitter layer 206 could be combined into one layer. Furthermore, a separate emitter layer could be interposed between layers 204 and 206 in FIG. 3A.

Patterning OEL materials and layers to form OEL devices provides a particularly suited example to illustrate some difficulties with conventional patterning techniques and how these difficulties can be overcome according to the present invention. With conventional patterning techniques, there may be some materials or layers that cannot be used due to susceptibility to attack, penetration, or dissolution from exposure to solvents or etchants used coat or pattern other layers on the display substrate. Thus, there may be device and/or display constructions that cannot be made by conventional techniques because a solvent-coated layer would be coated on top of or next to a solvent-susceptible layer, or because an etchant would be used to pattern layers on top of or next to other layers that are susceptible to the etchant. For example, in forming an OEL device that includes an anode on a substrate, a small molecule hole transport layer on the anode, a light emitting polymer emitter on the hole transport layer, and a cathode on the emitter layer, the solvent used to coat the light emitting polymer may damage the hole transport layer under conventional processing techniques. The same limitations may hold for conventional patterning of adjacent OEL devices, one of which contains a light emitting polymer emitter layer and the other of which contains an organic small molecule emitter layer. These limitations can be overcome using thermal patterning methods of the present invention. Overcoming these limitations allows a wider range of possible device constructions and materials alternatives, and these in turn may be used to achieve OEL devices and displays that exhibit characteristics such as brightness, lifetime, color purity, efficiency, etc., that might not otherwise be achieved. Thus, the present invention provides new OEL device and display constructions (as well as new patterning methods and new thermal transfer donor elements).

Stacks of different types of OEL materials and/or organic charge transport layers, as well as other device layers can be formed via thermal transfer from one or more donor elements. For example, a donor element can be made that has a transfer layer that includes a solvent-coated layer (e.g., a light emitting polymer, a conductive polymer, etc.) and a vapor-deposited or vacuum deposited layer (e.g., organic small molecule emitter or charge transport layer, etc.). The solvent-coated layer can be any suitable material such as light emitting polymers, whether doped or un-doped, other solvent-coatable conductive, semiconductive, or insulative materials that can act as light emitters, charge carriers (electron or hole transport), charge insulators (electron or hole blocking), color filters buffer layers, and the like. The vapor-deposited layer can be any suitable material including organic small molecule light emitters and/or charge carriers, other vapor deposited conductive or semiconductive organic or inorganic materials, insulative materials, and the like. An exemplary embodiment is one where the vapor deposited layer is coated over the solvent-coated layer as part of the transfer layer of a thermal transfer donor element so that, when transferred to a receptor, the vapor deposited layer is disposed between the solvent-coated material and the receptor. This is especially useful when the vapor deposited material is incompatible with the solvent of the solvent-coated material. Alternatively, different and/or incompatible layers or stacks of layers can be thermally transferred from separate donor elements to form multicomponent devices or structures on a receptor. For example, a solvent-coated material can be transferred on top of or next to a previously patterned material that is incompatible with the solvent.

In general, multicomponent transfer layers of thermal transfer donor elements can be formed by coating individual layers according to the following guidelines: vapor deposited organic small molecules or inorganic films can be deposited on top of any other layer type; solvent borne small molecules or polymers can be deposited on metal films or any material insoluble in the coating solvent; water borne small molecules or polymers can be deposited on metal films or any material insoluble in the aqueous solvent. These transfer layers can be patterned by selective thermal transfer onto receptors, including receptors that have layers previously patterned or deposited thereon by any suitable method. Also, any layer type that can be thermally mass transferred from a donor element can be transferred on top of or next to any other thermally mass transferred layers.

Figure 4A:
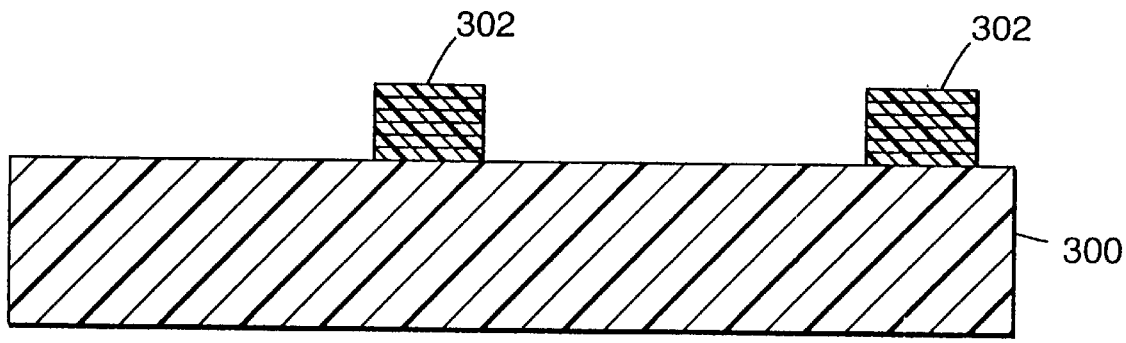
FIGS. 4A to 4C are cross-sectional views illustrating steps in one example of a process for forming a display device according to the invention.
Figure 4B:
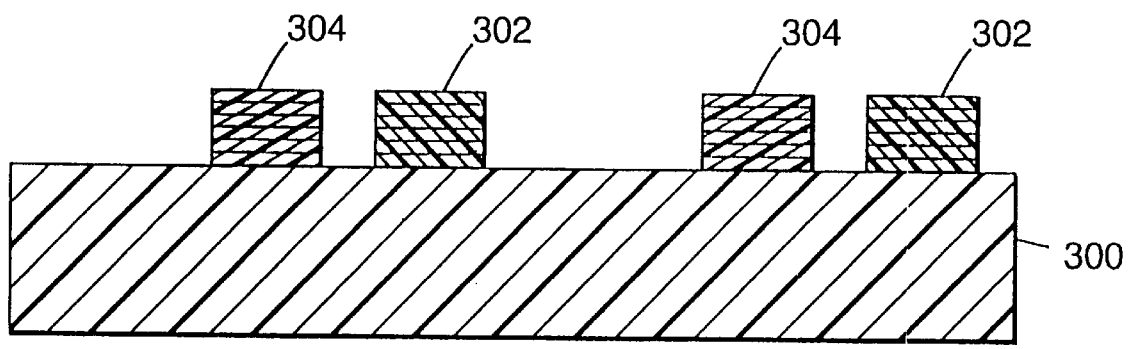
Figure 4C:
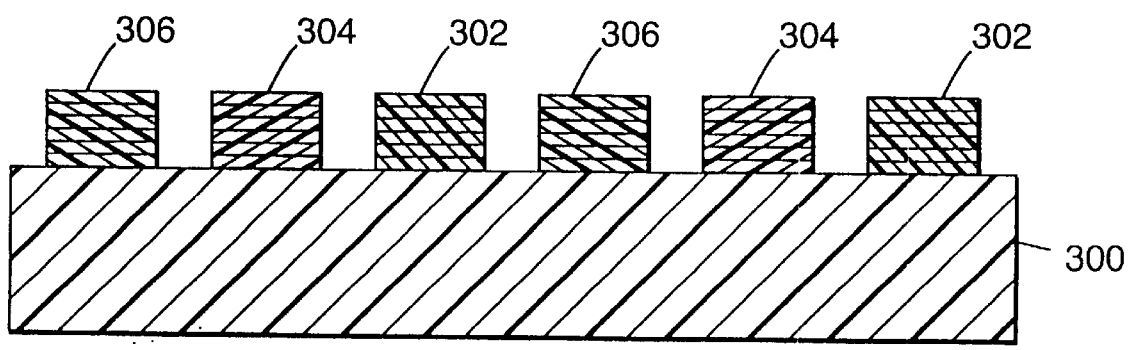

As discussed, OEL devices can be formed by selective thermal transfer from one or more donor elements. Multiple devices can also be transferred onto a receptor to form a pixilated display. As an example, an optical display can be formed as illustrated in FIGS. 4A through 4C. For example, green OEL devices 302 can be transferred onto the receptor substrate 300, as shown in FIG. 4A. Subsequently, blue OEL devices 304 and then red OEL devices 306 may be transferred, as shown in FIGS. 4B and 4C. Each of the green, blue, and red OEL devices 302, 304, 306 are transferred separately using green, blue, and red thermal transfer elements, respectively. Alternatively, the red, green, and blue thermal transfer elements could be transferred on top of one another to create a multi-color stacked OLED device of the type disclosed in U.S. Pat. No. 5,707,745, herein incorporated by reference. Another method for forming a full color device includes depositing columns of hole transport layer material and then sequentially depositing red, green, and blue electron transport layer/emitter multicomponent transfer units either parallel or perpendicular to the hole transport material. Yet another method for forming a full color device includes depositing red, green, and blue color filters (either conventional transmissive filters, fluorescent filters, or phosphors) and then depositing multicomponent transfer units corresponding to white light or blue light emitters.

Still another method for forming multi-color pixilated OEL displays is to pattern red, green, and blue emitters (for example) from three separate donors, and then, in a separate step, to pattern all the cathodes (and, optionally, electron transport layers) from a single donor element. In this way, each OEL device is patterned by at least two thermal transfers, the first of which patterns the emitter portion (and, optionally, an adhesive layer, a buffer layer, anode, hole injection layer, hole transport layer, electron blocking layer, and the like), and the second of which patterns the cathode portion (and, optionally, an electron injection layer, electron transport layer, hole blocking layer, and the like). One advantage of splitting the device layers between two or more donor elements (e.g., an emitter donor and a cathode donor) is that the same donor elements can be used to pattern the emitter portion of OEL devices for either passive matrix or active matrix display constructions. Generally, active matrix displays include a common cathode that is deposited over all the devices. For this constriction, thermal transfer of an emitter stack that includes a cathode may not be necessary, and having a cathode-less transfer stack may be desirable. For passive matrix displays, cathode-less donors can be used to transfer each of the emitter portions (a different donor for each color, if multi-color is desired), followed by patterning of the cathodes for each device from the, same, separate donor element. Thus, various emitter donors can be used for various display constructions, all while using the same, or similar, type of cathode donor.

Another advantage of the present invention is that OEL devices, for example, can be transferred and patterned according to the described methods to form adjacent devices having different, and otherwise incompatible, types of emitter materials. For example, red-emitting organic small molecule devices (e.g., that use an active vapor-deposited small molecule layer) can be patterned on the same receptor as blue-emitting light emitting polymer devices (e.g., that use an active solution-coated light emitting polymer layer). This allows flexibility to choose light-emitting materials (and other device layer materials) based on functionality (e.g., brightness, efficiency, lifetime, conductivity, physical properties after patterning (e.g., flexibility, etc.)) rather than on compatibility with the particular coating and/or patterning techniques used for the other materials in the same or adjacent devices. The ability to choose different types of emitter materials for different color devices in an OEL display can offer greater flexibility in choosing complementary device characteristics. The ability to use different types of emitters can also become important when the preferred emitter material for one OEL device is incompatible with the preferred emitter material for another OEL device.

Referring again to FIG. 4, this example also illustrates other advantages of using thermal transfer elements to pattern multiple different devices on a receptor. For example, the number of processing steps can be reduced as compared to conventional photolithography methods because many of the layers of each OEL device can be transferred simultaneously, rather than using multiple etching and masking steps. In addition, multiple devices and patterns can be created using the same imaging hardware. Only the thermal transfer element needs to be changed for each of the different devices 302, 304, 306.

The receptor substrate may be any item suitable for a particular application including, but not limited to, transparent films, display black matrices, passive and active portions of electronic displays (e.g., electrodes, thin film transistors, organic transistors, etc.), metals, semiconductors, glass, various papers, and plastics. Non-limiting examples of receptor substrates which can be used in the present invention include anodized aluminum and other metals, plastic films (e.g., polyethylene terephthalate, polypropylene), indium tin oxide coated plastic films, glass, indium tin oxide coated glass, flexible circuitry, circuit boards, silicon or other semiconductors, and a variety of different types of paper (e.g., filled or unfilled, calendered, or coated). For OEL displays, the type of receptor used often depends on whether the display is a top emission display (devices positioned between the viewer and the receptor substrate) or a bottom emission display (receptor substrate positioned between the viewer and the devices). For a top emission display, the receptor need not be transparent. For a bottom emission display, a transparent receptor substrate is typically desired.

Various layers (e.g., an adhesive layer) may be coated onto the receptor substrate to facilitate transfer of the transfer layer to the receptor substrate. Other layers may be coated on the receptor substrate to form a portion of a multilayer device. For example, an OEL or other electronic device may be formed using a receptor substrate having a metal and/or conductive organic anode or cathode formed on the receptor substrate prior to transfer of the transfer layer from the thermal transfer element. The anode or cathode may be formed, for example, by deposition of one or more conductive layers on the receptor substrate and patterning of the layer into one or more anodes or cathodes using any suitable method, for example, photolithographic techniques or the thermal transfer techniques taught herein.

A particularly useful receptor substrate for patterning multilayer devices is one that has a common electrode or a pattern of electrodes along with a pattern of insulating barriers on top of the electrode(s). The insulating barriers can be provided in a pattern that corresponds to the intended position of the edges of the multilayer devices to help prevent electrical shorts between the receptor electrode(s) and the opposing electrode transferred along with or on top of a multilayer stack. This is especially useful in passive matrix displays. Also, in active matrix display constructions, the insulating barriers can help isolate the transistors of the active matrix from the common electrode, which is generally provided. This can help prevent leakage currents and parasitic capacitance which can reduce device efficiencies.

Figure 5A:
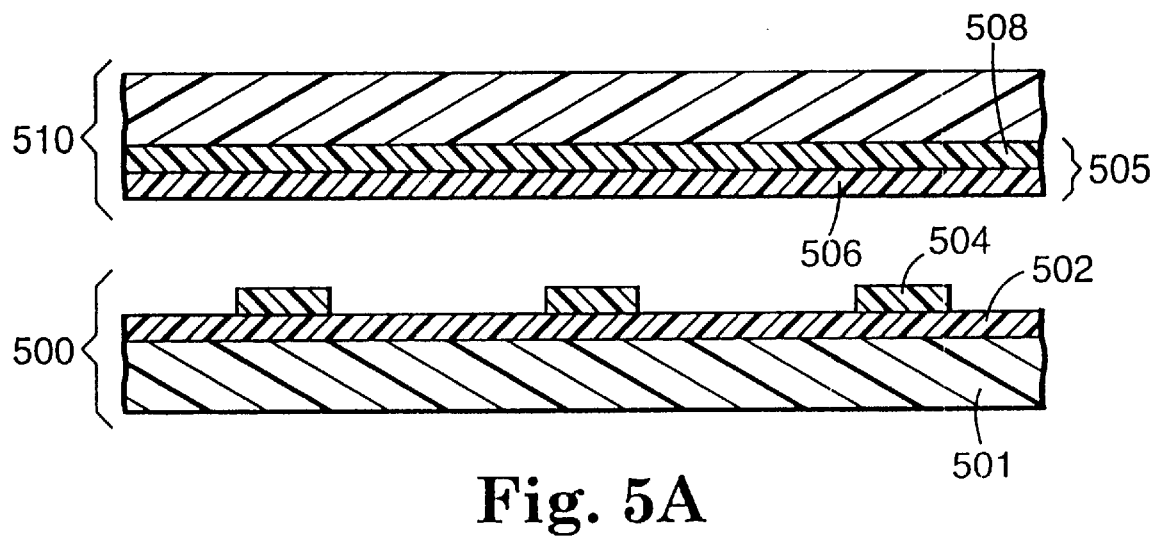
FIGS. 5A and 5B are cross-sectional views illustrating steps in one example of a process for forming a display device according to the invention.
Figure 5B:
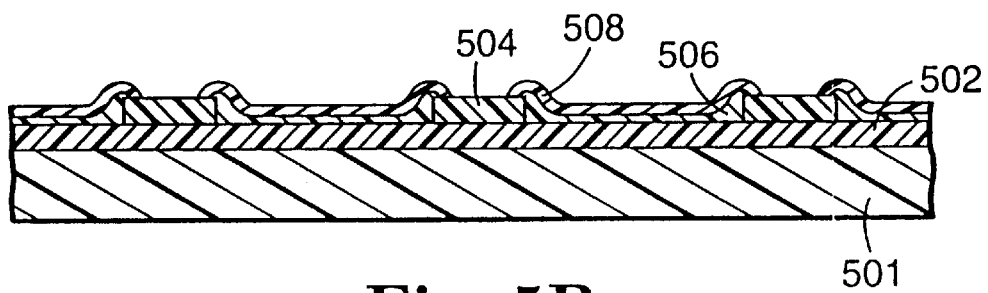

For example, FIG. 5A shows a cross-section of a receptor 500 that includes a substrate 501, a common electrode 502 disposed thereon, and a set of parallel insulating strips 504 disposed on the electrode 502. FIG. 5A also shows a donor element 510 that has a multicomponent transfer layer 505 that includes at least two layers, an electrode layer 508 and an emitter layer 506. Transfer layer 505 is to be transferred as parallel lines onto receptor 500 so that when an electric field is applied between receptor electrode 501 and device electrode 508, emitter layer 506 can emit light. As a practical matter (and in large part due to the thinness of layers 506 and 508), portions of electrode layer 508 at the edges of the transferred line may be likely to contact portions of the receptor after transfer. If this happened, the emitter device could be rendered inoperable due to one or more electrical shorts. Thus, insulating barriers 504 can be patterned onto the receptor (by thermal transfer or other suitable means) to cover areas where the edges of the transfer layers will be positioned upon transfer. Thus, as shown in FIG. 5B, if layer 508 overlaps layer 506 at the edges of a transferred line, layer 508 will contact insulating barrier 504, and the overall device will not short out due to contact with the underlying electrode 502 at the edges. Insulating barriers can be used for both passive matrix displays and active matrix displays.

Figure 6:
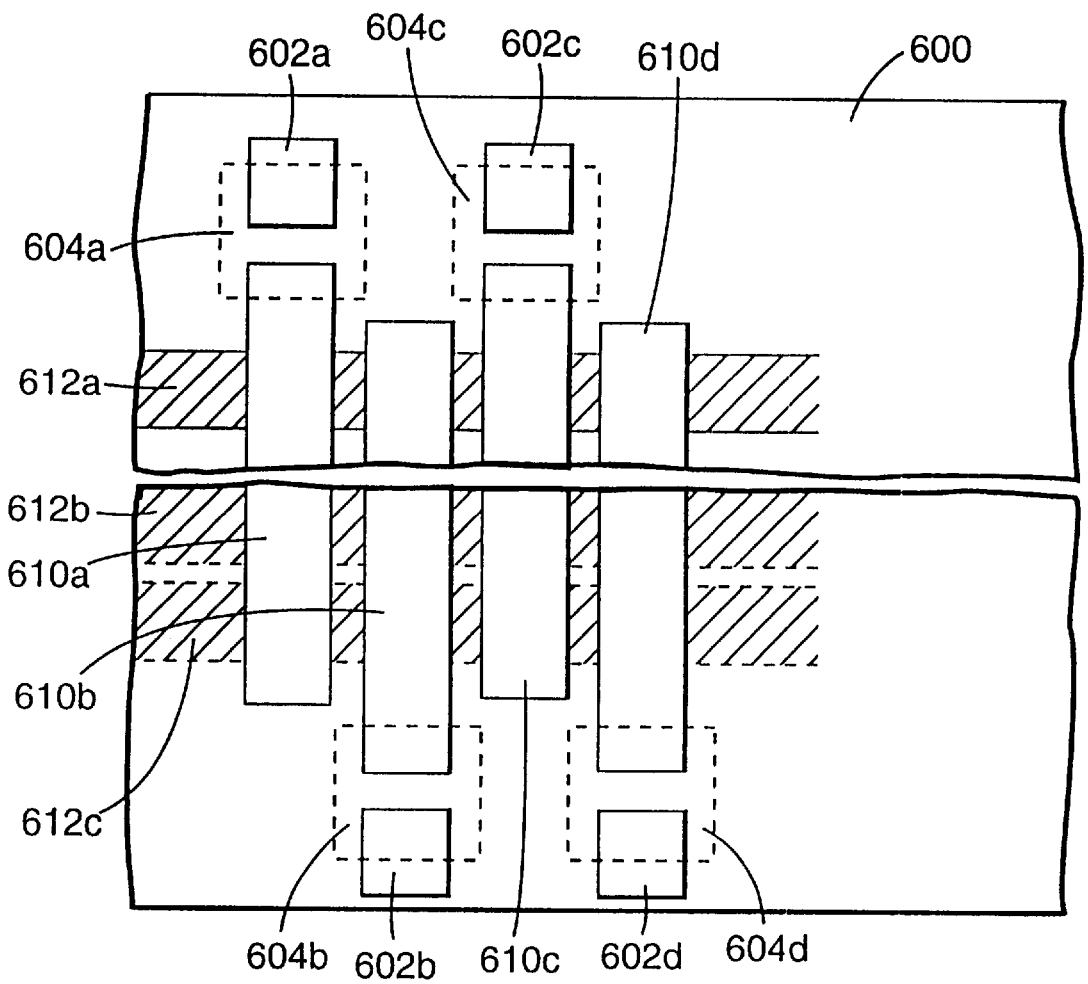
FIG. 6 is a partial top view of a display device made according to a method of the present invention.

Another receptor substrate useful for patterning OEL devices is one that includes electrode pads for connecting the device cathodes to the electronic driver system. For example, FIG. 6 shows a receptor 600 for a passive matrix display that includes anodes 612a, 612b, 612c, and so on patterned in parallel lines, and a plurality of contact pads 602a, 602b, 602c, 602d, and so on, for connection to device cathodes. Parallel lines can then be transferred from one or more donor elements to produce multilayer stacks 610a, 610b, 610c, 610d, and so on, to complete OEL devices. Each OEL device is positioned where an anode line and a multilayer stack line cross. At the cross portions, an emitter layer (an optional electron and hole transport and emitter layers, as well as other layers) is disposed between an anode and a cathode. Each line 610 terminates at one end adjacent an electrode pad 602. Conductor material can then be deposited in and around areas 604a, 604b, 604c, 604d, and so on, to connect the cathodes to the electrode pads, which in turn can be connected to the driver electronics. Conductor material can be deposited in areas 604 using any suitable technique include photolithography and mask-based vapor deposition. Alternatively, conductor material such as an organic conductor can be selectively transferred into areas 604 by thermal transfer from a donor element. As described above, thermal transfer from a donor element can be used to eliminate wet etching steps that may be required for photolithographic or mask-based techniques. Thermally transferred organic conductive layers can also be used to encapsulate the ends of the multilayer stacks, protecting the light emitting layers from corrosive agents. While FIG. 6 shows the situation for a passive matrix display, the concept of thermally transferring an organic conductor to connect a device to an electrode pad is equally applicable to active matrix displays.

EXAMPLES

In the following Examples, all of the vacuum deposited materials were thermally evaporated and deposited at room temperature. The deposition rate and to thickness of each vacuum deposited layer was monitored with a quartz crystal microbalance (Leybold Inficon Inc., East Syracuse, N.Y.). The background pressure (chamber pressure prior to the deposition) was roughly $1 \times 10^{-5}$ torr ($1.3 \times 10^{-3}$ Pa).

The laser transfer system included a CW Nd:YAG laser, acousto-optic modulator, collimating and beam expanding optics, an optical isolator, a linear galvonometer and an f-theta scan lens. The Nd:YAG laser was operating in the TEM 00 mode, and produced a total power of 7.5 Watts. Scanning was accomplished with a high precision linear galvanometer (Cambridge Technology Inc., Cambridge, Ma.). The laser was focused to a Gaussian spot with a measured diameter between 100 µm and 140 µm at the $1/e^2$ intensity level. The spot was held constant across the scan width by utilizing an f-theta scan lens. The laser spot was scanned across the image surface at a velocity of about 5 meters/second. The f-theta scan lens held the scan velocity uniform to within 0.1%, and the spot size constant to within ±3 microns.

Example 1

Preparation of a Substrate/LTHIC/Interlayer Element

A carbon black light-to-heat conversion layer was prepared by coating the following LTHC Coating Solution, according to Table 1, onto a 0.1 mm PET substrate with a Yasui Seiki Lab Coater, Model CAG-150 (Yasui Seiki Co., Bloomington, Ind.) using a microgravure roll of 381 helical cells per lineal cm (150 helical cells per lineal inch).

TABLE 1

LTHC Coating Solution

| Component | Parts by Weight |
|---|---|
| Raven ™ 760 Ultra carbon black pigment (available from Columbian Chemicals, Atlanta, GA) | 3.39 |
| Butvar ™ B-98 (polyvinylbutyral resin, available from Monsanto, St. Louis, MO) | 0.61 |
| Joncryl ™ 67 (acrylic resin, available from S.C. Johnson & Son, Racine, WI) | 1.81 |
| Elvacite ™ 2669 (acrylic resin, available from ICI Acrylics, Wilmington, DE) | 9.42 |
| Disperbyk ™ 161 (dispersing aid, available from Byk Chemie, Wallingford, CT) | 0.3 |
| FC-430 ™ (fluorochemical surfactant, available from 3M, St. Paul, MN) | 0.012 |
| Ebecryl ™ 629 (epoxy novolac acrylate, available from UCB Radcure, N. Augusta, SC) | 14.13 |
| Irgacure ™ 369 (photocuring agent, available from Ciba Specialty Chemicals, Tarrytown, NY) | 0.95 |
| Irgacure ™ 184 (photocuring agent, available from Ciba Specialty Chemicals, Tarrytown, NY) | 0.14 |
| propylene glycol methyl ether acetate | 16.78 |
| 1-methoxy-2-propanol | 9.8 |
| methyl ethyl ketone | 42.66 |

The coating was in-line dried at 40° C. and UV-cured at 6.1 m/min using a Fusion Systems Model I600 (400 W/in) UV curing system fitted with H-bulbs (Fusion UV Systems, Inc., Gaithersburg, Md.). The dried coating had a thickness of approximately 3 microns.

Onto the carbon black coating of the light-to-heat conversion layer was rotogravure coated an Interlayer Coating Solution, according to Table 2, using the Yasui Seiki Lab Coater, Model CAG-150 (Yasui Seiki Co., Bloomington, Ind.). This coating was in-line dried (40° C.) and UV-cured at 6.1 rn/min using a Fusion Systems Model I600 (600 W/in) fitted with H-bulbs. The thickness of the resulting interlayer coating was approximately 1.7 microns.

TABLE 2

Interlayer Coating Solution

| Component | Parts by Weight |
|---|---|
| Butvar ™ B-98 | 0.98 |
| Joncryl ™ 67 | 2.95 |
| Sartomer ™ SR351 ™ (trimethylolpropane triacrylate, available from Sartomer, Exton, PA) | 15.75 |
| Irgacure ™ 369 | 1.38 |
| Irgacure ™ 184 | 0.2 |
| 1-methoxy-2-propanol | 31.5 |
| methyl ethyl ketone | 47.24 |

Example 2

Preparation of Another Substrate/LTHC/Interlayer Element

A carbon black light-to-heat conversion layer was prepared by coating the following LTHC Coating Solution, according to Table 3, onto a 0.1 mm PET substrate with a Yasui Seiki Lab Coater, Model CAG-150 (Yasui Seiki Co., Bloomington, Ind.) using a microgravure roll of 228.6 helical cells per lineal cm (90 helical cells per lineal inch).

TABLE 3

LTHC Coating Solution

| Component | Parts by Weight |
|---|---|
| Raven ™ 760 Ultra carbon black pigment (available from Columbian Chemicals, Atlanta, GA) | 3.78 |
| Butvar ™ B-98 (polyvinylbutyral resin, available from Monsanto, St. Louis, MO) | 0.67 |
| Joncryl ™ 67 (acrylic resin, available from S.C. Johnson & Son, Racine, WI) | 2.02 |
| Disperbyk ™ 161 (dispersing aid, available from Byk Chemie, Wallingford, CT) | 0.34 |
| FC-430 ™ (fluorochemical surfactant, available from 3M, St. Paul, MN) | 0.01 |
| SR 351 ™ (trimethylolpropane triacrylate, available from Sartomer, Exton, PA) | 22.74 |
| Duracure ™ 1173 2-hydroxy-2-methyl-1-phenyl-1-propanone photoinitiator, available from Ciba, Hawthorne, NY) | 1.48 |
| 1-methoxy-2-propanol | 27.59 |
| methyl ethyl ketone | 41.38 |

The coating was in-line dried at 40° C. and UV-cured at 6.1 m/min using a Fusion Systems Model I600 (400 W/in) UV curing system fitted with H-bulbs. The dried coating had a thickness of approximately 3 microns.

Onto the carbon black coating of the light-to-heat conversion layer was rotogravure coated an Interlayer Coating Solution, according to Table 4, using the Yasui Seiki Lab Coater, Model CAG-150 (Yasui Seiki Co., Bloomington, Ind.). This coating was in-line dried (40° C.) and UV-cured at 6.1 m/min using a Fusion Systems Model I600 (600 W/in) fitted with H-bulbs. The thickness of the resulting interlayer coating was approximately 1.7 microns.

TABLE 4

Interlayer Coating Solution

| Component | Parts by Weight |
| --- | --- |
| Butvar ™ B-98 | 0.99 |
| Joncryl ™ 67 | 2.97 |
| SR 351 ™ | 15.84 |
| Duracure ™ 1173 | 0.99 |
| 1-methoxy-2-propanol | 31.68 |
| methyl ethyl ketone | 47.52 |

Example 3

Hole Transport Thermal Transfer Element

A hole transport thermal transfer element was formed using the substrate/LTHC/interlayer element of Example 1. A hole transport coating solution, formed by mixing the components of Table 5, was coated onto the interlayer using a #6 Mayer bar. The coating was dried for 10 min at 60° C.

TABLE 5

Hole Transport Coating Solution

| Component | Parts by Weight |
| --- | --- |
| N,N'-bis(3-methylphenyl)-N,N'-diphenylbenzidine | 2.5 |
| polyvinylcarbazole | 2.5 |
| cyclohexanone | 97.5 |
| propylene glycol methyl ether acetate (PGMEA) | 97.5 |

Example 4

OEL Small Molecule Thermal Transfer Element

An OEL thermal transfer element with a multicomponent transfer layer was prepared by applying coatings to a substrate/ALTHC/interlayer element formed according to Example 1. A 200 Å layer of copper phthalocyanine was deposited on the interlayer as a semiconducting release layer. Next, a 250 Å layer of aluminum was deposited as a cathode layer. A 10 Å layer of lithium fluoride was deposited on the aluminum. Next, a 300 Å layer of tris(8-hydroxyquinolinato) aluminum (ALQ) was deposited as an electron transport layer. Finally, a 200 Å layer of N,N'-bis (3-methylphenyl)-N,N'-diphenylbenzidine (TPD) was deposited as a hole transport layer.

Example 5

Preparation of an OEL Small Molecule Device

A receptor substrate of glass covered with indium tin oxide (ITO) (resistivity of 10 Ω/square, Thin Film Devices Inc., Anaheim, Calif.) was used to form the anode of the OEL device. First, the hole transport thermal transfer element of Example 3 was imaged onto the receptor. This was followed by imaging of the OEL small molecule thermal transfer element of Example 4 to complete the OEL device.

In each transfer, the transfer layer side of the thermal transfer element was held in intimate contact with the receptor in a vacuum chuck. A laser was directed to be incident upon the substrate side of the thermal transfer elements. The exposures were performed so that the two transfer layers were transferred with correct registration. This produced 120 μm wide lines. The final OEL device Lad layers in the following order (from top to bottom):

Aluminum Cathode

Lithium Fluoride

ALQ Electron Transport Layer/Emitter

TPD Hole Transport Layer (from OEL thermal transfer element)

TPD Hole Transport Layer (from hole transport thermal transfer element)

ITO and Glass Receptor

Electrical contact was made at the ITO anode and the aluminum cathode. When a potential was applied, the OEL device produced visually detectable light. The injection current was monitored as a function of the applied potential (voltage) which was continuously swept from 0 volts to 10–30 volts. At one point 70 μA at 10 volts flowing through a 42 mm×80 μm device was measured. This corresponds to a current density of about 2 mA/cm$^2$. The current density is well within the normal operating range of small molecule devices fabricated directly onto a receptor substrate using conventional techniques.

Example 6

Another OEL Small Molecule Thermal Transfer Element

An OEL thermal transfer element with a multicomponent transfer layer was prepared by applying coatings to a substrate/LTHC/interlayer element prepared according to Example 1. A primer solution, according to Table 6, was first coated using a #3 Mayer bar. The coating was dried at about 60° C. for about 5 minutes.

TABLE 6

Primer Solution

| Component | Parts by Weight |
| --- | --- |
| PVP K-90 (polyvinyl pyrrolidone, International Specialty Products, Wayne, NJ) | 2 |
| PVA Gohsenol KL-03 (polyvinyl alcohol, Nippon Gohsei, Osaka, Japan) | 2 |
| Elvacite 2776 (acrylic polymer, ICI Acrylics) | 4 |
| DMEA (dimethylethanolamine, Aldrich) | 0.8 |
| 2-butoxyethanol (Aldrich) | 0.8 |
| deionized water | 150.4 |

A 200 Å layer of copper phthalocyanine was deposited as a semiconducting release layer on the primer layer. Next, a 250 Å layer of aluminum was deposited as a cathode layer. A 10 Å layer of lithium fluoride was deposited on the aluminum. Next, a 300 Å layer of ALQ was deposited as an electron transport layer. Finally, a 200 Å layer of TPD was deposited as a hole transport layer.

Example 7

Transfer of a Partial OEL Small Molecule Transfer Layer to a Flexible Substrate The receptor substrate consisted of a piece of 4 mil (about 100 μm) PET film (unprimed HPE100, Teijin Ltd., Osaka, Japan). First, the hole transport thermal transfer element of Example 3 was imaged onto the receptor. Then the OEL thermal transfer element of Example 6 was imaged onto the hole transport layer.

In each transfer, the transfer layer side of the thermal transfer element was held in intimate contact with the receptor in a vacuum chuck. A laser was directed to be incident upon the substrate side of the thermal transfer elements. The exposures were performed so that the two layers with correct registration. This produced 120 μm wide lines. The final construction had layers in the following order (from top to bottom):

Aluminum Cathode
Lithium Fluoride
ALQ Electron Transport Layer/Emitter
TPD Hole Transport Layer (from OEL Thermal Transfer Element)
TPD Hole Transport Layer (from hole transport thermal transfer element)
PET Receptor Example 8

OEL Light Emitting Polymer Thermal Transfer Element

An OEL thermal transfer element with a multicomponent transfer layer was prepared by applying coatings to a substrate/LTHC/interlayer element formed according to Example 1. A 100 Å layer of copper phthalocyanine was deposited on the interlayer as a release layer. Next, a 450 Å layer of aluminum was deposited as a cathode layer. A light emitting polymer coating solution was then prepared by adding 2% by weight of poly(9,9-di-n-octylfluorene) (designated "PFC8" in these Examples) in toluene and then diluting the solution with MEK until a 1% by weight concentration of PFC8 was achieved. PFC8 is a blue emitting polyfluorene material that has a chemical structure as shown below, and that can be synthesized according to the methods disclosed in U.S. Pat. No. 5,777,070, which is incorporated into this document.

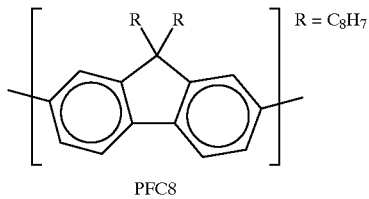

PFC8

The coating solution was hand coated onto the aluminum layer using a #6 Mayer bar and dried to form a 1000 Å layer of PFC8 as a blue light emitting layer. Finally, a 500 Å layer of NPB Was deposited as a hole transport layer.

Example 9

Another OEL Light Emitting Polymer Thermal Transfer Element

An OEL thermal transfer element with a multicomponent transfer layer was prepared by applying coatings to a substrate/LTHC/interlayer element formed according to Example 1. A 100 Å layer of copper phthalocyanine was deposited on the interlayer as a release layer. Next, a 450 Å layer of aluminum was deposited as a cathode layer. A light emitting polymer coating solution was then prepared by adding 2% by weight of a copolymer of PFC8 and benzothiadiazole (copolymer designated "PFC8ABDTZ" in these Examples) in toluene and then diluting the solution with MEK until a 1% by weight concentration of PFC8/BTDZ copolymer was achieved. PFC8/BDTZ is a green light emitting polyfluorene copolymer. The coating solution was hand coated onto the aluminum layer using a #6 Mayer bar and dried to form a 1000 Å layer of PFC8/BTDZ as a green light emitting layer. Finally, a 500 Å layer of NPB was deposited as a hole transport layer.

Example 10

Preparation of an OEL Light Emitting Polymer Device

A receptor substrate of glass covered with ITO (resistivity of 10 Ω/square, Thin Film Devices Inc., Anaheim, Calif.) was used to form the anode of the OEL devices. The ITO covered glass was then spin coated at 3000 r.p.m. with an aqueous solution of 2.5% by weight polypyrrole (sold under the trade designation Baytron-P, Bayer Corp., Pittsburgh, Pa.). The polypyrrole coating was then dried at 80° C. for 5 minutes to form a buffer layer on the receptor substrate.

A blue light emitting polymer device was formed when the thermal transfer element of Example 8 was imaged onto the receptor. The transfer layer side of the thermal transfer element of Example 8 was held in intimate contact with the receptor in a vacuum chuck. A laser was directed to be incident upon the substrate side of the thermal transfer element, using a dose of 0.6 J/cm$^2$. This produced 100 μm wide lines. The final OEL device had layers in the following order (from top to bottom):

Aluminum Cathode
PFC8 Blue Light Emitting Polymer Layer
NPB Hole Transport Layer
Polypyrrole Buffer Layer (coated directly onto the receptor)
ITO and Glass Receptor Electrical contact was made at the ITO anode and the aluminum cathode. When a potential was applied, the OEL device produced visually detectable blue light.

Example 11

Preparation of Another OEL Light Emitting Polymer Device

A receptor substrate of glass covered with ITO (resistivity of 10 Ω/square, Thin Film Devices Inc., Anaheim, Calif.) was used to form the anode of the OEL devices. The ITO covered glass was then spin coated at 3000 r.p.m. with an aqueous solution of 2.5% by weight polypyrrole. The polypyrrole coating was then dried at 80° C. for 5 minutes to form a buffer layer on the receptor substrate.

A green light emitting polymer device was formed when the thermal transfer element of Example 9 was imaged onto the receptor. The transfer layer side of the thermal transfer element of Example 9 was held in intimate contact with the receptor in a vacuum chuck. A laser was directed to be incident upon the substrate side of the thermal transfer element, using a dose of 0.6 J/cm². This produced 100 μm wide lines. The final OEL device had layers in the following order (from top to bottom):

Aluminum Cathode
PFC8IBTDZ Green Light Emitting Polymer Layer
NPB Hole Transport Layer
Polypyrrole Buffer Layer (coated directly onto the receptor)
ITO and Glass Receptor Electrical contact was made at the ITO anode and the aluminum cathode. When a potential was applied, the OEL device produced visually detectable blue light.

Examples 8–11 demonstrate that OEL devices that have solvent-coated light emitting polymer layers disposed on top of vacuum-deposited organic small molecule layers pan be patterned onto substrates. This was accomplished by forming donor elements that had organic small molecule material vapor coated onto dried solvent-coated light emitting polymer layers, and then selectively transferring the multicomponent transfer stack to a receptor substrate.

Example 12

Cathode Layer Thermal Transfer Element

A cathode layer thermal transfer element was formed using the substrate/LTHC/interlayer element of Example 1. A 100 Å layer of copper phthalocyanine was deposited on the interlayer as a release layer. Next, a 450 Å layer of aluminum was deposited as a cathode layer. Finally, a 500 Å layer of 3-(4-Biphenyl)-4-phenyl-5-(4-tert-butylphenyl)-1,2,4-triazole (TAZ-01) was deposited on the aluminum layer as an organic small molecule electron transport/adhesion promoting layer.

Example 13

Light Emitting Polymer Thermal Transfer Element

A light emitting polymer thermal transfer element with a single component transfer layer was prepared. A light emitting polymer coating solution was prepared by adding 2% by weight of PFC8 in toluene and then diluting the solution with MEK until a 1% by weight concentration of PFC8 was achieved. The coating solution was hand coated onto to the interlayer of a substrate/LTHC/interlayer element (formed according to Example 1) using a #6 Mayer bar. The coating was dried to form a 1000 Å polyfluorene transfer layer.

Example 14

Another Light Emitting Polymer Thermal Transfer Element

A light emitting polymer thermal transfer element with a single component transfer layer was prepared. A light emitting polymer coating solution was prepared by adding 2% by weight of PFC8/BTDZ in toluene and then diluting the solution with MEK until a 1% by weight concentration of PFC8/BTDZ was achieved. The coating solution was hand coated onto to the interlayer of a substrate/LTHC/interlayer element (formed according to Example 1) using a #6 Mayer bar. The coating was dried to form a 1000 Å polyfluorene transfer layer.

Example 15

Preparation of an OEL Light Emitting Polymer Device

A receptor substrate of glass covered with ITO (resistivity of 10 Ω/square, Thin Film Devices Inc., Anaheim, Calif.) was used to form the anode of the OEL devices. The ITO covered glass was then spin coated at 3000 r.p.m. with an aqueous solution of 2.5% by weight polypyrrole. The polypyrrole coating was then dried at 80° C. for 5 minutes to form a buffer layer on the receptor substrate.

The thermal transfer element of Example 13 was imaged onto the receptor to form 100 μm wide lines of a blue light emitting polymer material on the polypyrrole buffer layer. The transfer layer side of the thermal transfer element of Example 13 was held in intimate contact with the receptor in a vacuum chuck. A laser was directed to be incident upon the substrate side of the thermal transfer element, using a dose of 0.6 3/cm². Next, the cathode thermal transfer element of Example 12 was imaged onto the receptor to form 100 μm wide lines on top of and in registry with the lines of light emitting polymer material previously transferred. The transfer layer side of the thermal transfer element of Example 12 was held in intimate contact with the receptor in a vacuum chuck. A laser was directed to be incident upon the substrate side of the thermal transfer element, using a dose of 0.6 j/cm².

The final OEL device had layers in the following order (from top to bottom):

Aluminum Cathode
TAZ-01 Electron Transport Layer
PFC8 Blue Light Emitting Polymer Layer
Polypyrrole Buffer Layer (coated directly onto the receptor)
ITO and Glass Receptor Electrical contact was made at the ITO anode and the aluminum cathode. When a potential was applied, the OEL device produced visually detectable blue light.

Example 16

Preparation of another OEL Light Emitting Polymer Device

A receptor substrate of glass covered with ITO (resistivity of 10 Ω/square, Thin Film Devices Inc., Anaheini, Calif.) was used to fotlin the anode of the OEL devices. The ITO covered glass was then spin coated at 3000 r.p.m. with an aqueous solution of 2.5% by weight polypyrrole. The polypyrrole coating was then dried at 80° C. for 5 minutes to form a buffer layer on the receptor substrate.

The thermal transfer element of Example 14 was imaged onto the receptor to form 100 μm wide lines of a green light emitting polymer material on the polypyrrole buffer layer. The transfer layer side of the thermal transfer element of Example 14 was held in intimate contact with the receptor in a vacuum chuck. A laser was directed to be incident upon the substrate side of the thermal transfer element, using a dose of 0.6 J/cm². Next, the cathode thermal transfer element of Example 12 was imaged onto the receptor to form 100 μm wide lines on top of and in registry with the lines of light emitting polymer material previously transferred. The transfer layer side of the thermal transfer element of Example 12 was held in intimate contact with the receptor in a vacuum chuck. A laser was directed to be incident upon the substrate side of the thermal transfer element, using a dose of 0.6 J/cm$^2$.

The final OEL device had layers in the following order (from top to bottom):
Aluminum Cathode
TAZ-01 Electron Transport Layer
PFC8/BTDZ Green Light Emitting Polymer Layer
Polypyrrole Buffer Layer (coated directly onto the receptor)
ITO and Glass Receptor Electrical contact was made at the ITO anode and the aluminum cathode. When a potential was applied, the OEL device produced visually detectable green light.

Examples 12–16 demonstrate that the same cathode donor element can be used to pattern cathode layers on top of different emitter layers, previously patterned, to form OEL devices.

Example 17

Preparation of Small Molecule and Light Emitting Polymer OEL Devices on the Same Receptor Substrate This Example demonstrates that functional OEL devices that have light emitting polymer emitter layers and OEL devices that have organic small molecule emitter layers can be patterned next to each other on receptor substrates.

A thermal transfer element with a multicomponent transfer layer having a green light small molecule emitter ("Green SM Donor") was prepared by applying coatings to a substrate/LTHC/interlayer element formed according to Example 1. A 100 Å layer of copper phthalocyanine was deposited on the interlayer as a release layer. Next, a 450 Å layer of aluminum was deposited as a cathode layer. A 10 Å layer of lithium fluoride was deposited on the aluminum. Next, a 500 Å layer of ALQ was deposited as an electron transport layer. Finally, a 500 Å layer of NPB was deposited as a hole transport layer.

A thermal transfer element with a multicomponent transfer layer having a red light small molecule emitter ("Red SM Donor") was prepared by applying coatings to a substrate/ LTHC/interlayer element formed according to Example 1. A 100 Å layer of copper phthalocyanine was deposited on the interlayer as a release layer. Next, a 450 Å layer of aluminum was deposited as a cathode layer. A 10 Å layer of lithium fluoride was deposited on the aluminum. Next, a 500 Å layer of ALQ was deposited as an electron transport layer. Next, a layer of platinum octa ethyl porphyrin (PtOEP) was vapor deposited on the ALQ layer as a dopant. The PtOEP dopant was deposited to achieve a 2 to 3% by weight concentration of the dopant in the ALQ emitter layer. Finally, a 500 Å layer of NPB was deposited as a hole transport layer.

A thermal transfer element was made according to Example 8 to produce a donor element having a blue light emitting polymer emitter ("Blue LEP Donor"). A thermal transfer element was made according to Example 9 to produce a donor element having a green light emitting polymer emitter ("Green LEP Donor").

A receptor substrate of glass covered with ITO (resistivity of 10 Ω/square, Thin Film Devices Inc., Anaheim, Calif.) was used to form the anode of the OEL devices. The ITO covered glass was then spin coated at 3000 r.p.m. with an aqueous solution of 2.5% by weight polypyrrole. The polypyrrole coating was then dried at 80° C. for 5 minutes to form a buffer layer on the receptor substrate.

The Blue LEP Donor was imaged onto the receptor substrate to form a series of parallel lines. Next, the Red SM Donor was imaged onto the same receptor for form a series of parallel lines, each line positioned between lines transferred from the Blue LEP Donor. Electrical contact was made at the ITO anodes and aluminum cathodes. Visibly detected blue light was emitted from the lines patterned from the Blue LEP Donor and visibly detected red light was emitted from the lihes patterned from the Red SM Donor.

The Green LEP Donor was then imaged onto another receptor substrate to form a series of parallel lines. Next, the Green SM Donor was imaged onto the same receptor for form a series of parallel lines, each line positioned between lines transferred from the Green LEP Donor. Electrical contact was made at the ITO anodes and aluminum cathodes. Visibly detected green light was emitted from the lines patterned from the Green LEP Donor and visibly detected green light was emitted from the lines patterned from the Green SM Donor.

Example 18

Preparation of Red, Green, and Blue OEL Devices on the Same Receptor Substrate

This Example demonstrates that functional red, green, and blue OEL devices can be patterned next to each other on the same receptor substrate.

A thermal transfer element with a multicomponent transfer layer having a blue light small molecule emitter ("Blue SM Donor") was prepared by applying coatings to a substrate/LTHC/interlayer element formed according to Example 1. A 100 Å layer of copper phthalocyanine was deposited on the interlayer as a release layer. Next, a 450 Å layer of aluminum was deposited as a cathode layer. A 10 Å layer of lithium; fluoride was deposited on the aluminum. Next, a 500 Å layer of Bis(2-methyl-8-quinolinolato)(para-phenyl-phenolato)aluminum (BAlq) was deposited as an electron transport/emitter layer. The BAlq was synthesized as described in U.S. Pat. No. 5,141,671, the disclosure of which is incorporated into this document. Next, a layer of perylene was vapor deposited on the BAlq layer as a dopant. The perylene dopant was deposited to achieve a 2 to 3% by weight concentration of the dopant in the BAlq emitter layer. Finally, a 500 Å layer of NPB was deposited as a hole transport layer.

A receptor substrate of glass covered with ITO (resistivity of 10 Ω/square, Thin Film Devices Inc., Anaheim, Calif.) was used to form the anode of the OEL devices. The ITO covered glass was then spin coated at 3000 r.p.m. with an aqueous solution of 2.5% by weight polypyrrole. The polypyrrole coating was then dried at 80° C. for 5 minutes to form a buffer layer on the receptor substrate.

The Red SM Donor of Example 17, the Green SM Donor of Example 17, and the Blue SM Donor of this Example were successively imaged onto the receptor substrate to form a series of parallel lines. The lines were patterned so that a line transferred from one donor was positioned between lines transferred from each of the other two donors. Electrical contact was made at the ITO anodes and aluminum cathodes. Visibly detected green light was emitted from the lines patterned from the Green SM Donor, visibly detected red light was emitted from the lines patterned from the Red SM Donor, and visibly detected blue light was emitted from the lines patterned from the Blue SM Donor.

The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the instant specification.

What is claimed is:

1. An organic electroluminescent display comprising:
   a first organic electroluminescent device disposed on a display substrate, the first organic electroluminescent device having an emitter layer that is a light emitting polymer; and
   a second organic electroluminescent device disposed on the display substrate, the second organic electroluminescent device having an emitter layer that is an organic small molecule material.

2. An organic electroluminescent display comprising an organic electroluminescent device disposed on a display substrate, the organic electroluminescent device comprising, in the following order from the substrate, a first electrode, an organic small molecule charge transport layer, a solvent coated polymer emitter layer, and a second electrode, wherein the small molecule charge transport layer is incompatible with the solvent used to coat the polymer emitter layer.

3. The organic electroluminescent display of claim 2, wherein the solvent coated polymer emitter layer is formed by solvent coating the polymer emitter layer onto a thermal transfer donor sheet to form at least a portion of a transfer layer, and selectively thermally transferring the transfer layer onto a receptor comprising the substrate, the first electrode, and the organic small molecule charge transport layer.

* * * * *

UNITED STATES PATENT AND TRADEMARK OFFICE
CERTIFICATE OF CORRECTION

PATENT NO.   : 6,291,116 B1
DATED        : September 18, 2001
INVENTOR(S)  : Wolk, Martin B.

It is certified that error appears in the above-identified patent and that said Letters Patent is hereby corrected as shown below:

Column 2,
Line 37, delete "multicompolelit" and insert in place thereof -- multicomponent --.

Column 4,
Line 47, insert -- . -- following "thereof".

Column 10,
Line 31, delete "butyral," and insert in place thereof -- butyral. --.

Column 11,
Line 12, delete "1 50° C." and insert in place thereof -- 150° C. --.

Column 14,
Lines 38-39, delete "sandwhiched" and insert in place thereof -- sandwiched --.

Column 17,
Line 32, delete "filters" and insert in place thereof -- filters, --.

Column 18,
Line 42, delete "constriction," and insert in place thereof -- construction, --.

Column 21,
Line 67, delete "6.1 rn/min" and insert in place thereof -- 6.1 m/min --.

Column 24,
Line 2, delete "Lad" and insert in place thereof -- had --.

Column 25,
Line 54, delete "A" and insert in place thereof -- Å --.
Line 56, delete "Was" and insert in place thereof -- was --.

Column 26,
Line 4, delete " "PFC8ABDTZ" " and insert in place thereof -- "PFC8/BDTZ" --.
Line 51, delete "Another" and insert thereof -- another --.

Column 27,
Line 5, delete "PFC8IBTDZ" and insert in place thereof -- PFC8/BTDZ --.

UNITED STATES PATENT AND TRADEMARK OFFICE
CERTIFICATE OF CORRECTION

PATENT NO.    : 6,291,116 B1
DATED         : September 18, 2001
INVENTOR(S)   : Wolk, Martin B.

It is certified that error appears in the above-identified patent and that said Letters Patent is hereby corrected as shown below:

Column 28,
Line 21, delete "0.6 3/cm$^2$" and insert in place thereof -- 0.6 J/cm$^2$ --.
Line 29, delete "0.6 j/cm$^2$" and insert in place thereof -- 0.6 J/cm$^2$ --.
Line 49, delete "Anaheini" and insert in place thereof -- Anaheim --.
Line 51, delete "fotlin" and insert in place thereof -- form --.

Column 30,
Line 16, delete "lihes" and insert in place thereof -- lines --.

Signed and Sealed this

Twenty-eighth Day of May, 2002

Attest:

JAMES E. ROGAN
*Attesting Officer*        *Director of the United States Patent and Trademark Office*